United States Patent
Kim et al.

(10) Patent No.: US 10,727,282 B2
(45) Date of Patent: Jul. 28, 2020

(54) FLEXIBLE DISPLAY DEVICE AND METHOD OF MANUFACTURING THE SAME

(71) Applicant: Samsung Display Co., Ltd., Yongin-si (KR)

(72) Inventors: Kyungseop Kim, Hwaseong-si (KR); Sangyoun Han, Seoul (KR); Sungkyun Park, Suwon-si (KR); Yongwoo Park, Yongin-si (KR); Jungha Son, Seoul (KR); Jae-wook Kang, Seongnam-si (KR); Hanyung Jung, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 218 days.

(21) Appl. No.: 15/386,734

(22) Filed: Dec. 21, 2016

(65) Prior Publication Data
US 2017/0330917 A1    Nov. 16, 2017

(30) Foreign Application Priority Data

May 13, 2016    (KR) .......................... 10-2016-0059110

(51) Int. Cl.
*G06F 3/041*    (2006.01)
*H01L 27/32*    (2006.01)
(Continued)

(52) U.S. Cl.
CPC .......... *H01L 27/323* (2013.01); *G06F 3/0412* (2013.01); *H01L 27/3276* (2013.01);
(Continued)

(58) Field of Classification Search
None
See application file for complete search history.

(56) References Cited

U.S. PATENT DOCUMENTS

| 6,573,459 B2 | 6/2003 | Baker et al. |
| 2003/0054653 A1 | 3/2003 | Yamazaki et al. |

(Continued)

FOREIGN PATENT DOCUMENTS

| JP | 2002-359246 | 12/2002 |
| KR | 10-0671422 | 1/2007 |
| KR | 10-2016-0141357 | 12/2016 |

OTHER PUBLICATIONS

Extended European Search Report dated Oct. 16, 2017, issued in European Application No. EP 17170774.8.
(Continued)

*Primary Examiner* — Brian M Butcher
(74) *Attorney, Agent, or Firm* — H.C. Park & Associates, PLC

(57) ABSTRACT

A flexible display device includes a flexible substrate and a conductive pattern. The flexible substrate includes a bending part. The conductive pattern includes a first conductive pattern layer and a second conductive pattern layer disposed on the first conductive pattern layer, and at least a portion of the conductive pattern may be disposed on the bending part. The first conductive pattern layer has a first thickness and includes a first material, and the second conductive pattern layer has a second thickness smaller than the first thickness and includes a second material different from the first material.

32 Claims, 29 Drawing Sheets

(51) Int. Cl.
*H01L 51/00* (2006.01)
*H01L 51/52* (2006.01)
*H01L 51/56* (2006.01)
*G06F 3/044* (2006.01)
*H01L 27/12* (2006.01)

(52) U.S. Cl.
CPC ...... *H01L 51/0097* (2013.01); *H01L 51/5203* (2013.01); *H01L 51/5246* (2013.01); *H01L 51/56* (2013.01); *G06F 3/044* (2013.01); *G06F 2203/04102* (2013.01); *G06F 2203/04103* (2013.01); *G06F 2203/04112* (2013.01); *H01L 27/124* (2013.01); *H01L 27/1218* (2013.01); *H01L 27/3288* (2013.01); *H01L 2227/323* (2013.01); *H01L 2251/301* (2013.01); *H01L 2251/305* (2013.01); *H01L 2251/308* (2013.01); *H01L 2251/5338* (2013.01); *H01L 2251/558* (2013.01); *Y02E 10/549* (2013.01); *Y02P 70/521* (2015.11)

(56) References Cited

U.S. PATENT DOCUMENTS

| 2015/0261259 A1* | 9/2015 | Endo ................ G06F 1/1652 361/679.06 |
| 2016/0035759 A1 | 2/2016 | Kwon et al. |
| 2016/0093685 A1 | 3/2016 | Kwon et al. |

OTHER PUBLICATIONS

Lukac et al., "Influence of Grain Size on Ductility of Magnesium Alloys", Materials Engineering, 2011, pp. 111-114, vol. 18.

Koch, "Optimization of strength and ductility in nanocrystalline and ultrafine grained metals", Scripta Materialia, 2003, pp. 657-662, vol. 49, Elsevier Ltd.

Wang et al., "Ductile crystalline-amorphous nanolaminates", Proceedings of the National Academy of Sciences of the United States of America, Jul. 3, 2007, pp. 11155-11160, vol. 104, No. 27, National Academy of Sciences of the United States of America.

\* cited by examiner

FLEXIBLE DISPLAY DEVICE AND METHOD OF MANUFACTURING THE SAME

CROSS-REFERENCE TO RELATED APPLICATION

This application claims priority from and the benefit of Korean Patent Application No. 10-2016-0059110, filed on May 13, 2016, which is hereby incorporated by reference for all purposes as if fully set forth herein.

BACKGROUND

Field

Exemplary embodiments relate to a flexible display device and a method of manufacturing the same. More particularly, exemplary embodiments relate to a flexible display device capable of preventing a crack from occurring due to bending and a method of manufacturing the flexible display device.

Discussion of the Background

A display device displays various images to provide a user with information. In recent years, a bendable display device has been developed. Different from a flat display device, a flexible display device is folded, rolled, or curved like a sheet of paper. The flexible display device having various shapes is easy to carry and improves user's convenience.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a flexible display device capable of preventing a crack from occurring due to a bending deformation.

Exemplary embodiments provide a method of manufacturing the flexible display device to prevent a crack from occurring due to a bending deformation.

Additional aspects will be set forth in the detailed description which follows, and, in part, will be apparent from the disclosure, or may be learned by practice of the inventive concept.

An exemplary embodiment discloses a flexible display device including a flexible substrate and a conductive pattern. The flexible substrate includes a bending part. The conductive pattern includes a first conductive pattern layer and a second conductive pattern layer disposed on the first conductive pattern layer, and at least a portion of the conductive pattern may be disposed on the bending part. The first conductive pattern layer has a first thickness and includes a first material, and the second conductive pattern layer has a second thickness smaller than the first thickness and includes a second material different from the first material.

An exemplary embodiment also discloses a flexible display device including a flexible display panel including a flexible substrate, an organic light emitting element disposed on the flexible substrate, and a sealing layer disposed on the organic light emitting element and a touch sensing unit including a touch bending part and disposed on the sealing layer. The touch sensing unit includes a conductive pattern including a first conductive pattern layer and a second conductive pattern layer disposed on the first conductive pattern layer and being included in the touch bending part, the first conductive pattern layer has a first thickness and includes a first material, and the second conductive pattern layer has a second thickness smaller than the first thickness and includes a second material different from the first material.

An exemplary embodiment further discloses a method of manufacturing a flexible display device, including preparing a flexible substrate and providing a conductive pattern on the flexible substrate. The providing of the conductive pattern includes supplying a first gas to form a first conductive pattern layer having a first thickness on the flexible substrate and supplying a second gas different from the first gas to form a second conductive pattern layer having a second thickness smaller than the first thickness on the first conductive pattern layer.

An exemplary embodiment further discloses a flexible conductive pattern. The flexible conductive pattern includes a first conductive pattern layer disposed on a flexible substrate and includes a first material having a first thickness. A second conductive pattern layer is disposed on the first conductive pattern layer and includes a second material different from the first material, the second material having a second thickness smaller than the first thickness.

According to an exemplary embodiment of the flexible display device, cracking caused by bending may be reduced.

According to an exemplary embodiment of the manufacturing method of the flexible display device, the flexible display device may be manufactured in which cracks caused by bending may be reduced.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1A:
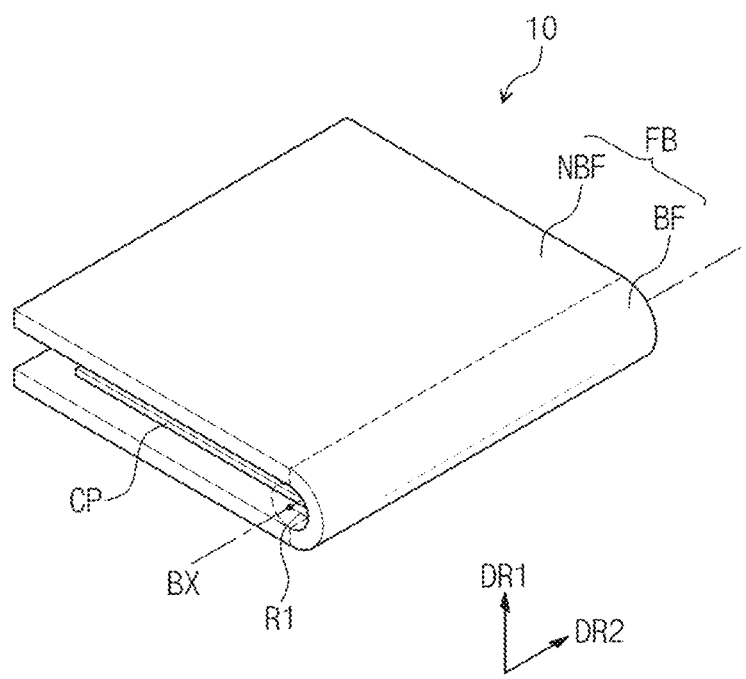
FIGS. 1A, 1B, and 1C are perspective views showing a flexible display device according to an exemplary embodiment of the present disclosure.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
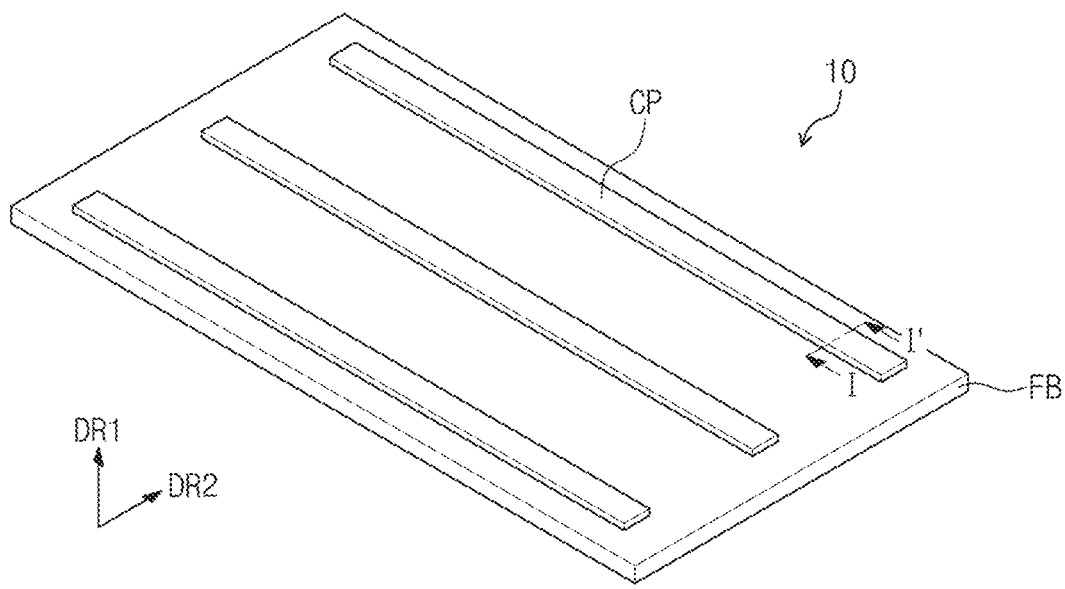
Figure 1C:
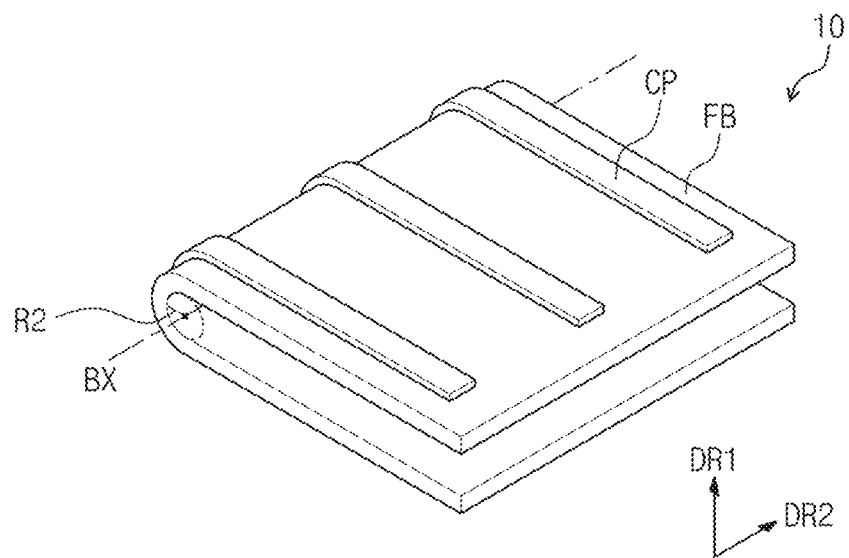

FIGS. 1A, 1B, and 1C are perspective views showing a flexible display device 10 according to an exemplary embodiment of the present disclosure.

Referring to FIGS. 1A, 1B, and 1C, the flexible display device 10 may include a flexible substrate FB and a conductive pattern CP. The conductive pattern CP may be disposed on the flexible substrate FB in a first direction DR1. As used herein, the term "flexible" means that the substrate may be designed to be bendable, and thus the flexible substrate FB may be completely folded or partially bent. The flexible substrate FB may include, but is not limited to, a plastic material or an organic polymer, e.g., polyethylene terephthalate (PET), polyethylene naphthalate (PEN), polyimide, polyether sulfone, etc. The material for the flexible substrate FB may be selected in consideration of a mechanical strength, a thermal stability, a transparency, a surface smoothness, an ease of handling, a water repellency, etc. The flexible substrate FB may be transparent.

The flexible display device 10 may be operated in a first mode or a second mode. The flexible substrate FB may include a bending part BF and a non-bending part NBF. The bending part BF may be bent in the first mode with respect to a bending axis BX extending in a second direction DR2 and stretched in the second mode. The bending part BF may be connected to the non-bending part NBF. The non-bending part NBF may be not bent in the first and second modes. At least a portion of the conductive pattern CP may be disposed on the bending part BF. As used herein, the term "bending" means that the flexible substrate FB may be curved in a specific shape due to an external force. For instance, the bending part may be rigid or flexible. The bending part may be a concept that encompasses all of curved, foldable, stretchable, rollable, and flexible parts.

Referring to FIGS. 1A and 1C, at least a portion of the flexible substrate FB and the conductive pattern CP may be bent in the first mode. Referring to FIG. 1B, the bending part BF may be stretched in the second mode.

The first mode may include a first bending mode and a second bending mode. Referring to FIG. 1A, the flexible display device 10 may be bent in one direction with respect to the bending axis BX in the first bending mode. That is, the flexible display device 10 may be inwardly bent in the first bending mode. Hereinafter, when the flexible display device 10 may be bent with respect to the bending axis BX, a state that a distance between portions, which face each other after the conductive pattern CP may be bent, of the conductive pattern CP may be shorter than a distance between portions, which face each other after the flexible substrate FB may be bent, of the flexible substrates FB may be referred to as an inner bending. In the inner bending state, a surface of the bending part BF has a first radius of curvature R1. The first radius of curvature R1 may be in a range equal to or greater than about 1 mm and equal to or smaller than about 10 mm.

Referring to FIG. 1C, the flexible display device 10 may be bent in a direction opposite to the one direction in FIG. 1A with respect to the bending axis BX in the second bending mode. That is, the flexible display device 10 may be outwardly bent in the second bending mode. Hereinafter, when the flexible display device 10 may be bent with respect to the bending axis BX, a state that a distance between portions, which face each other after the flexible substrate FB may be bent, of the flexible substrate FB may be shorter than a distance between portions, which face each other after the conductive pattern CP may be bent, of the conductive pattern CP may be referred to as an outer bending. In the outer bending state, a surface of the bending part BF may have a second radius of curvature R2. The second radius of curvature R2 may be equal to or different from the first radius of curvature R1. The second radius of curvature R2 may be in a range equal to or greater than about 1 mm and equal to or smaller than about 10 mm.

In FIGS. 1A and 1C, when the flexible display device 10 may be bent with respect to the bending axis BX, the distance between the portions facing each other of the flexible substrate FB may be constant, but it should not be limited thereto or thereby. That is, the distance between the portions facing each other of the flexible substrate FB may not be constant. In addition, in FIGS. 1A and 1C, when the flexible display device 10 may be bent with respect to the bending axis BX, an area of one portion of the portions of the bent flexible substrate FB may be equal to an area of the other portion of the portions of the bent flexible substrate FB, but it should not be limited thereto or thereby. That is, the area of one portion of the portions of the bent flexible substrate FB may be different from the area of the other portion of the portions of the bent flexible substrate FB.

Figure 2A:
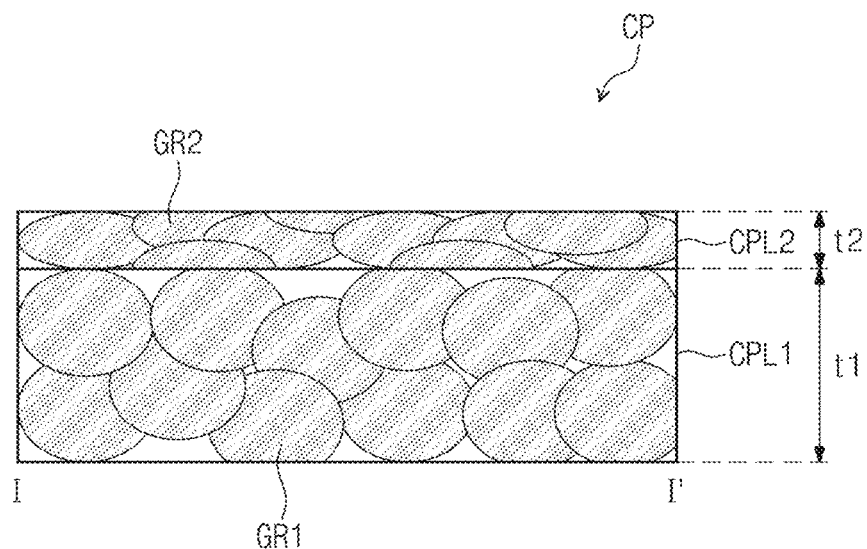
FIGS. 2A, 2B, and 2C are cross-sectional views taken along a line I-I' of FIG. 1B.
Figure 2B:
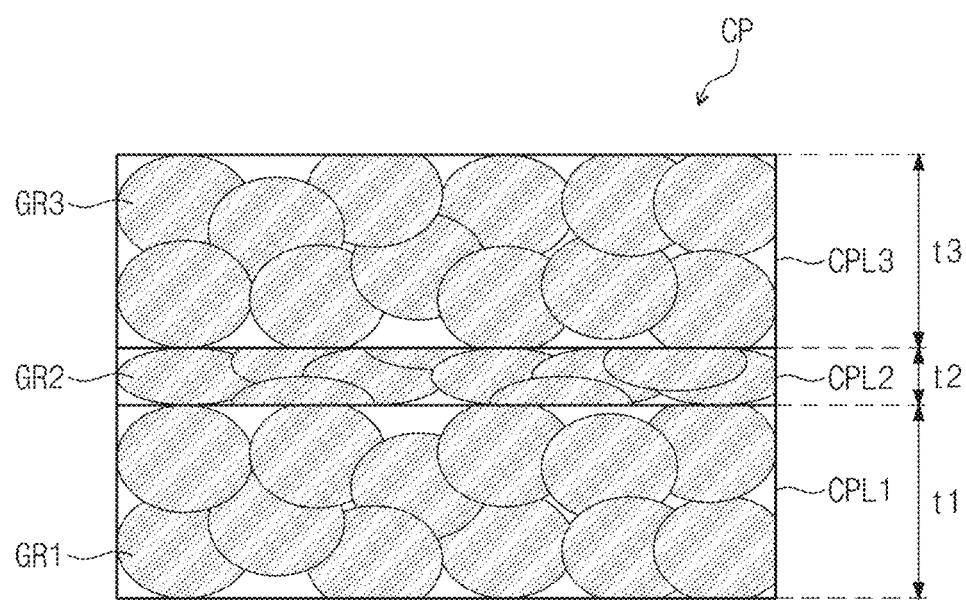
Figure 2C:
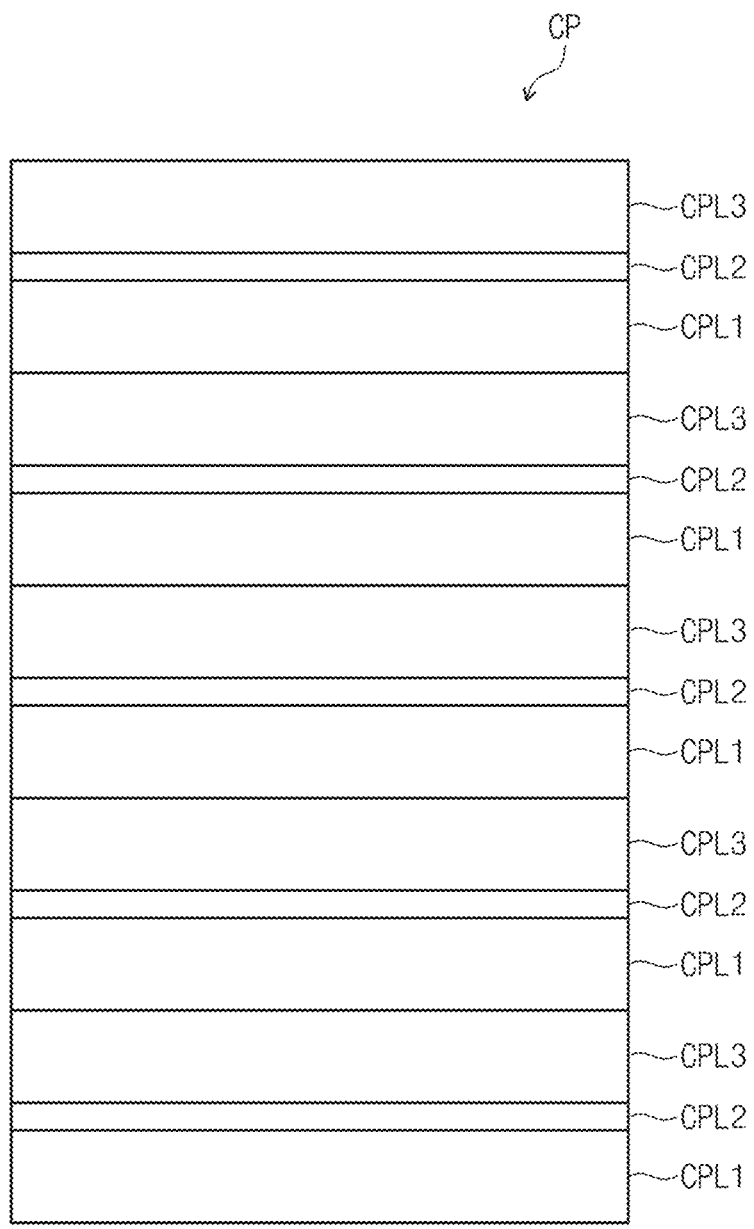

FIGS. 2A, 2B, and 2C are cross-sectional views taken along a line I-I' of FIG. 1B.

Referring to FIGS. 1A, 1B, 1C, and 2A, at least the portion of the conductive pattern CP may be disposed on the bending part BF. The conductive pattern CP may include a plurality of conductive pattern layers. The conductive pattern CP may include two, three, four, five, or six conductive pattern layers, but it should not be limited thereto or thereby. That is, the conductive pattern CP may include seven or more conductive pattern layers. Each conductive pattern layer may include a plurality of grains. The grains are crystal grains obtained by regularly arranging component atoms.

Referring to FIGS. 1A, 1B, 1C, and 2A, the conductive pattern CP may include a first conductive pattern layer CPL1 and a second conductive pattern layer CPL2. The first conductive pattern layer CPL1 may have a first thickness t1 equal to or greater than about 100 angstroms and equal to or smaller than about 1500 angstroms. When the first thickness t1 of the first conductive pattern layer CPL1 is smaller than about 100 angstroms, the number of interfaces between the conductive pattern layers increases even though the thickness of the conductive pattern is not changed, and thus a resistance of the conductive pattern layers increases. Accordingly, power consumption used to drive the flexible display device 10 increases. In addition, a reliability of the processes of manufacturing and providing the first conductive pattern layer CPL1 may deteriorate. When the first thickness t1 of the first conductive pattern layer CPL1 exceeds about 1500 angstroms, it may be difficult to secure flexibility of the first conductive pattern layer CPL1, and as a result, a crack or disconnection may occur in the first conductive pattern layer CPL1, thereby deteriorating the reliability.

The first conductive pattern layer CPL1 may include first grains GR1 each having a first grain size. Hereinafter, the grain size may indicate an average of particle diameters or a maximum particle diameter. The first grains GR1 of the first conductive pattern layer CPL1 may have the first grain size equal to or greater than about 100 angstroms and equal to or smaller than about 1000 angstroms. In more detail, the first grain size of each of the first grains GR1 may be equal to or greater than about 100 angstroms and equal to or smaller than about 1000 angstroms, the average of the first grain sizes of the first grains GR1 may be equal to or greater than about 100 angstroms and equal to or smaller than about 1000 angstroms, and a representative value of the first grain sizes may be equal to or greater than about 100 angstroms and equal to or smaller than about 1000 angstroms.

When the first grain size of the first grains GR1 of the first conductive pattern layer CPL1 is smaller than about 100 angstroms, a resistance of the first conductive pattern layer CPL1 increases, and thus the power consumption required to drive the flexible display device 10 increases. When the first grain size of the first grains GR1 of the first conductive pattern layer CPL1 exceeds about 1000 angstroms, it may be difficult to secure flexibility of the bending of the first conductive pattern layer CPL1 since the first grain size may be too large. As a result, a crack or disconnection occurs in the first conductive pattern layer CPL1 and reliability of the flexible display device 10 may deteriorate.

The first conductive pattern layer CPL1 may include a first material. The first material may include at least one of a metal, a metal alloy, and a transparent conductive oxide, but it should not be limited thereto or thereby.

The metal may include, but is not limited to, at least one of Al, Cu, Ti, Mo, Ag, Mg, Pt, Pd, Au, Ni, Nd, Ir, and Cr.

The transparent conductive oxide may include, but is not limited to, at least one of indium tin oxide (ITO), indium zinc oxide (IZO), zinc oxide (ZnO), and indium tin zinc oxide (ITZO).

In the first conductive pattern layer CPL1, about 200 grains to about 1200 grains are arranged within a unit area of about 1.0 square micrometers ($\mu m^2$). The term of "within the unit area of about 1.0 square micrometers ($\mu m^2$)" means that the unit area may be defined in an arbitrary area on a plane surface of the first conductive pattern layer CPL1. When the number of the first grains GR1 in the unit area of about 1.0 square micrometers ($\mu m^2$) is smaller than about 200, it may be difficult to secure the flexibility of bending. Thus, the crack or disconnection of the first connection pattern layer CPL1 occurs, and the reliability of the flexible display device 10 may deteriorate. In addition, when the number of the first grains GR1 in the unit area of about 1.0 square micrometers ($\mu m^2$) exceeds about 1200, the resistance of the first conductive pattern layer CPL1 increases, and thus the power consumption required to drive the flexible display device 10 increases.

The second conductive pattern layer CPL2 may be disposed on the first conductive pattern layer CPL1. The second conductive pattern layer CPL2 may have a second thickness t2 equal to or greater than about 10 angstroms and equal to or smaller than about 100 angstroms. The second thickness t2 may be thinner than the first thickness t1. When the second thickness t2 of the second conductive pattern layer CPL2 is smaller than about 10 angstroms, it may be difficult to prevent the first grain size of the first conductive pattern layer CPL1 from being excessively expanded. In addition, a reliability of the processes of manufacturing and providing the second conductive pattern layer CPL2 may deteriorate. When the second thickness t2 of the second conductive pattern layer CPL2 exceeds about 100 angstroms, it may be difficult to secure the flexibility of the second conductive pattern layer CPL2, and as a result, a crack or disconnection occurs in the second conductive pattern layer CPL2, thereby deteriorating the reliability.

The second conductive pattern layer CPL2 prevents the first grains GR1 of the first conductive pattern layer CPL1 from being connected to the second grains GR2 of the second conductive pattern layer CPL2. The second conductive pattern layer CPL2 may control the first grain size of the first conductive pattern layer CPL1. For instance, the second conductive pattern layer CPL2 may prevent the first grain size of the first conductive pattern layer CPL1 from excessively increasing.

The second conductive pattern layer CPL2 may include second grains GR2 each having a second grain size. The second grains GR2 of the second conductive pattern layer CPL2 have the second grain size equal to or greater than about 100 angstroms and equal to or smaller than about 1000 angstroms. In more detail, an average of the second grain sizes of the second grains GR2 of the second conductive pattern layer CPL2 may be smaller than the average of the first grain sizes of the first grains GR1 of the first conductive pattern layer CPL1. The second conductive pattern layer CPL2 may include a second material. The second material may be different from the first material. The second material may include at least one of a metal, a metal alloy, and a transparent conductive oxide, but it should not be limited thereto or thereby.

The metal may include, but is not limited to, at least one of Al, Cu, Ti, Mo, Ag, Mg, Pt, Pd, Au, Ni, Nd, Ir, and Cr.

The transparent conductive oxide may include, but is not limited to, at least one of indium tin oxide (ITO), indium zinc oxide (IZO), zinc oxide (ZnO), and indium tin zinc oxide (ITZO).

Referring to FIGS. 1A, 1B, 1C, and 2B, the conductive pattern CP may include the first conductive pattern layer CPL1, the second conductive pattern layer CPL2, and a third conductive pattern layer CPL3. The second conductive pattern layer CPL2 may be disposed on the first conductive pattern layer CPL1. The third conductive pattern CPL3 may be disposed on the second conductive pattern layer CPL2.

The conductive pattern CP may include, for example, the first conductive pattern layer CPL1 including aluminum, the second conductive pattern layer CPL2 disposed on the first conductive pattern layer CPL1 and including titanium, and the third conductive pattern layer CPL3 disposed on the second conductive pattern layer CPL2 and including aluminum. In this case, the first conductive pattern layer CPL1, the second conductive pattern layer CPL2, and the third conductive pattern layer CPL3 may have thicknesses of about 1500 angstroms, about 50 angstroms, and about 1500 angstroms, respectively.

The conductive pattern CP may include, for example, the first conductive pattern layer CPL1 including aluminum, the second conductive pattern layer CPL2 disposed on the first conductive pattern layer CPL1 and including aluminum oxide, and the third conductive pattern layer CPL3 disposed on the second conductive pattern layer CPL2 and including aluminum.

The third conductive pattern layer CPL3 may have a third thickness t3 equal to or greater than about 100 angstroms and equal to or smaller than about 1500 angstroms. The third thickness t3 may be thicker than the second thickness t2. The third thickness t3 may be equal to or different from the first thickness t1. When the third thickness t3 of the third conductive pattern layer CPL3 is smaller than about 100 angstroms, the number of interfaces between the conductive pattern layers increases even though the thickness of the conductive pattern is not changed, and thus a resistance of the conductive pattern layers increases. Accordingly, power consumed to drive the flexible display device 10 increases. In addition, a reliability of the processes of manufacturing and providing the third conductive pattern layer CPL3 may deteriorate. When the third thickness t3 of the third conductive pattern layer CPL3 exceeds about 1500 angstroms, it may be difficult to secure flexibility of the third conductive pattern layer CPL3, and as a result, a crack or disconnection occurs in the third conductive pattern layer CPL3, thereby deteriorating the reliability.

The third conductive pattern layer CPL3 may include third grains GR3 each having a third grain size. The third grains GR3 of the third conductive pattern layer CPL3 have the third grain size equal to or greater than about 100 angstroms and equal to or smaller than about 1000 angstroms. In more detail, the third grain size of each of the third grains GR3 may be equal to or greater than about 100 angstroms and equal to or smaller than about 1000 angstroms, the average of the third grain sizes of the third grains GR3 may be equal to or greater than about 100 angstroms and equal to or smaller than about 1000 angstroms, and a representative value of the third grain sizes may be equal to or greater than about 100 angstroms and equal to or smaller than about 1000 angstroms. The average of the third grain sizes of the third grains GR3 of the third conductive pattern layer CPL3 may be greater than the average of the second grain sizes of the second grains GR2 of the second conductive pattern layer CPL2.

When the third grain size of the third conductive pattern layer CPL3 may be smaller than about 100 angstroms, a resistance of the third conductive pattern layer CPL3 increases, and thus the power consumption required to drive the flexible display device 10 increases. When the third grain size of the third conductive pattern layer CPL3 exceeds about 1000 angstroms, it may be difficult to secure flexibility of the bending of the third conductive pattern layer CPL3 since the third grain size may be too large. As a result, a crack or disconnection occurs in the third conductive pattern layer CPL3 and reliability of the flexible display device 10 may deteriorate.

The third conductive pattern layer CPL3 may include a third material. The third material may be different from the second material. The third material may be equal to or different from the first material. The third material may include at least one of a metal, a metal alloy, and a transparent conductive oxide, but it should not be limited thereto or thereby.

The metal may include, but is not limited to, at least one of Al, Cu, Ti, Mo, Ag, Mg, Pt, Pd, Au, Ni, Nd, Ir, and Cr.

The transparent conductive oxide may include, but is not limited to, at least one of indium tin oxide (ITO), indium zinc oxide (IZO), zinc oxide (ZnO), and indium tin zinc oxide (ITZO).

In the third conductive pattern layer CPL3, about 200 grains to about 1200 grains are arranged within a unit area of about 1.0 square micrometers ($\mu m^2$). The term of "within the unit area of about 1.0 square micrometers ($\mu m^2$)" means that the unit area may be defined in an arbitrary area on a plane surface of the third conductive pattern layer CPL3. When the number of the third grains GR3 in the unit area of about 1.0 square micrometers ($\mu m^2$) is smaller than about 200, it may be difficult to secure the flexibility of being able to bend. Thus, the crack or disconnection of the third connection pattern layer CPL3 may occur, and the reliability of the flexible display device 10 may deteriorate. In addition, when the number of the third grains GR3 in the unit area of about 1.0 square micrometers ($\mu m^2$) exceeds about 1200, the resistance of the third conductive pattern layer CPL3 may increase, and thus the power consumption required to drive the flexible display device 10 may increase.

Referring to FIG. 2C, the conductive pattern CP may include five stacking patterns, and each of the stacking patterns may include the first conductive pattern layer CPL1, the second conductive pattern layer CPL2 disposed on the first conductive pattern layer CPL1, and the third conductive pattern layer CPL3 disposed on the second conductive pattern layer CPL2. For example, the conductive pattern CP may include the first conductive pattern layer CPL1 including aluminum, the second conductive pattern layer CPL2 disposed on the first conductive pattern layer CPL1 and including titanium, and the third conductive pattern layer CPL3 disposed on the second conductive pattern layer CPL2 and including aluminum.

In general, when the grain size of the conductive pattern CP decreases, the resistance of the conductive pattern CP increases. Thus the power consumption used to drive the flexible display device 10 may increase, however, the flexibility of the conductive pattern CP may be secured, and the flexible display device 10 may have improved flexibility. On the contrary, when the grain size of the conductive pattern CP increases, the resistance of the conductive pattern CP decreases. However, it may be difficult to secure flexibility of the bending of the flexible display device 10, and as a result, a crack or disconnection occurs.

The conductive pattern CP of the flexible display device 10 according to the present exemplary embodiment may include the first conductive pattern layer CPL1 having the first thickness t1 and including the first material and the second conductive pattern layer CPL2 having the second thickness t2 smaller than the first thickness t1 and including the second material different from the first material. The second conductive pattern layer CPL2 may prevent the first grain size of the first conductive pattern layer CPL1 from excessively increasing. Accordingly, when compared with a structure in which the conductive pattern is configured to include only one layer, the conductive pattern CP included in the flexible display device 10 according to the present exemplary embodiment may have enough resistance to secure appropriate driving characteristic and improved flexibility.

Figure 3A:
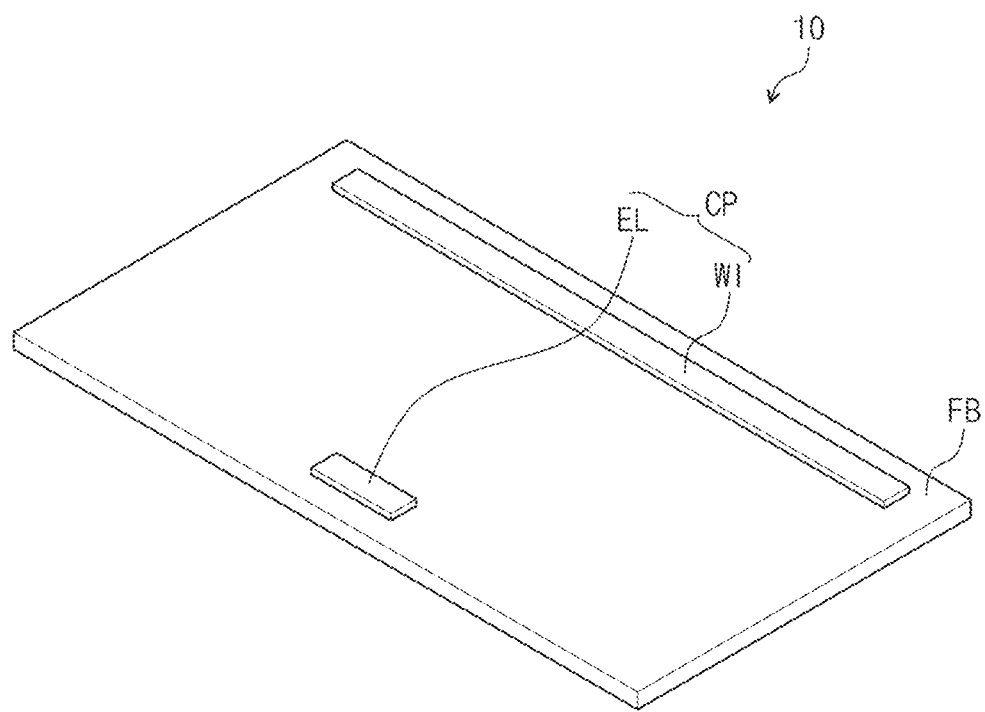
FIG. 3A is a perspective view showing a flexible display device according to an exemplary embodiment of the present disclosure.
Figure 3B:
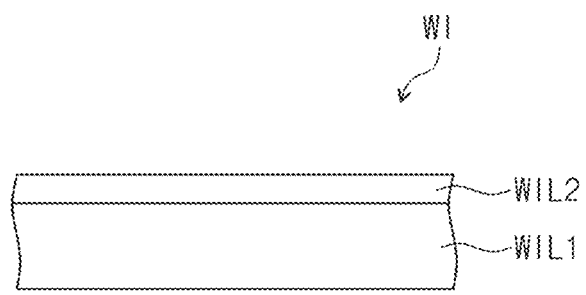
FIGS. 3B and 3C are cross-sectional views showing a wiring included in a flexible display device according to an exemplary embodiment of the present disclosure.
Figure 3C:
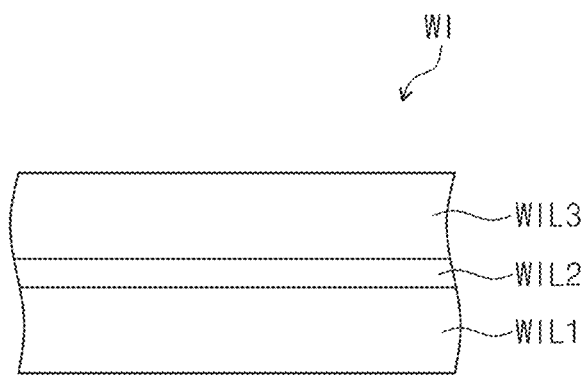
Figure 3D:
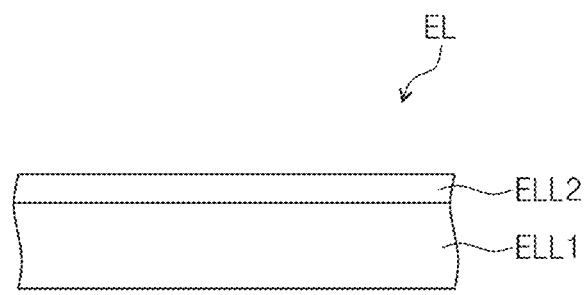
FIGS. 3D and 3E are cross-sectional views showing an electrode included in a flexible display device according to an exemplary embodiment of the present disclosure.
Figure 3E:
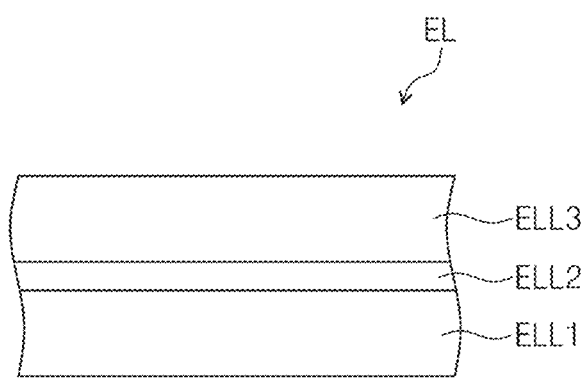

FIG. 3A is a perspective view showing a flexible display device 10 according to an exemplary embodiment of the present disclosure. FIGS. 3B and 3C are cross-sectional views showing a wiring included in a flexible display device according to an exemplary embodiment of the present disclosure. FIGS. 3D and 3E are cross-sectional views showing an electrode included in a flexible display device according to an exemplary embodiment of the present disclosure.

Referring to FIGS. 1A, 1B, 1C, 3A, 3B, 3C, 3D, and 3E, the flexible display device 10 may include a flexible substrate FB, a wiring WI, and an electrode EL. At least one of the wiring WI and the electrode EL may be the conductive pattern CP. The wiring WI and the electrode EL may be included in a touch sensing unit TSU (refer to FIG. 5A), and a flexible display panel DP (refer to FIG. 5A).

The wiring WI may be disposed on the flexible substrate FB. At least a portion of the wiring WI may be disposed on the bending part BF. For instance, the wiring WI may be disposed on the bending part BF and not disposed on the non-bending part NBF, but it should not be limited thereto or thereby. That is, the wiring WI may be disposed on the bending part BF and the non-bending part NBF.

Referring to FIGS. 1A, 1B, 1C, 3A, 3B, and 3C, the wiring WI may include a plurality of wiring layers. The wiring WI may include two, three, four, five, or six wiring layers, but it should not be limited thereto or thereby. That is, the wiring WI may include seven or more wiring layers. The wiring WI may include a first wiring layer WIL1 and a second wiring layer WIL2. The first wiring layer WIL1 may include first grains each having a first grain size. The first wiring layer WIL1 may include a first material. The second wiring layer WIL2 may be disposed on the first wiring layer WIL1. The second wiring layer WIL2 may include second grains each having a second grain size. The second wiring layer WIL2 may include a second material. The second material may be different from the first material. The second wiring layer WIL2 may have a thickness smaller than that of the first wiring layer WIL1.

The wiring WI may further include a third wiring layer WIL3. The third wiring layer WIL3 may include third grains each having a third grain size. The third wiring layer WIL3 may include a third material. The third material may be different from the second material. The third material may be equal to or different from the first material. The third wiring layer WIL3 may have a thickness greater than that of the second wiring layer WIL2.

Referring to FIGS. 1A, 1B, 1C, 3A, 3D, and 3E, the electrode EL may be disposed on the flexible substrate FB. At least a portion of the electrode EL may be disposed on the bending part BF. For instance, the electrode EL may be disposed on the bending part BF and not disposed on the non-bending part NBF, but it should not be limited thereto or thereby. That is, the electrode EL may be disposed on the bending part BF and the non-bending part NBF.

The electrode EL may be electrically connected to the wiring WI. The electrode EL may be spaced apart from the wiring WI, but it should not be limited thereto or thereby. For instance, the electrode EL may be integrally connected to the wiring WI.

The electrode EL and the wiring WI may be disposed on the same layer, but it should not be limited thereto or thereby. The electrode EL and the wiring WI may be disposed on different layers from each other. Although not shown in figures, an intermediate layer may be interposed between the wiring WI and the electrode EL.

The electrode EL may include a plurality of electrode layers. The electrode EL may include two, three, four, five, or six electrode layers. The electrode EL may include a first electrode layer ELL1 and a second electrode layer ELL2. The first electrode layer ELL1 may include first grains each having a first grain size. The first electrode layer ELL1 may include a first material. The second electrode layer ELL2 may be disposed on the first electrode layer ELL1. The second electrode layer ELL2 may include second grains each having a second grain size. The second electrode layer ELL2 may include a second material. The second material may be different from the first material. The second electrode layer ELL2 may have a thickness smaller than that of the first electrode layer ELL1.

The electrode EL may further include a third electrode layer ELL3. The third electrode layer ELL3 may include third grains each having a third grain size. The third electrode layer ELL3 may include a third material. The third material may be different from the second material. The third material may be equal to or different from the first material. The third electrode layer ELL3 may have a thickness greater than the thickness of the second electrode ELL2.

Figure 4A:
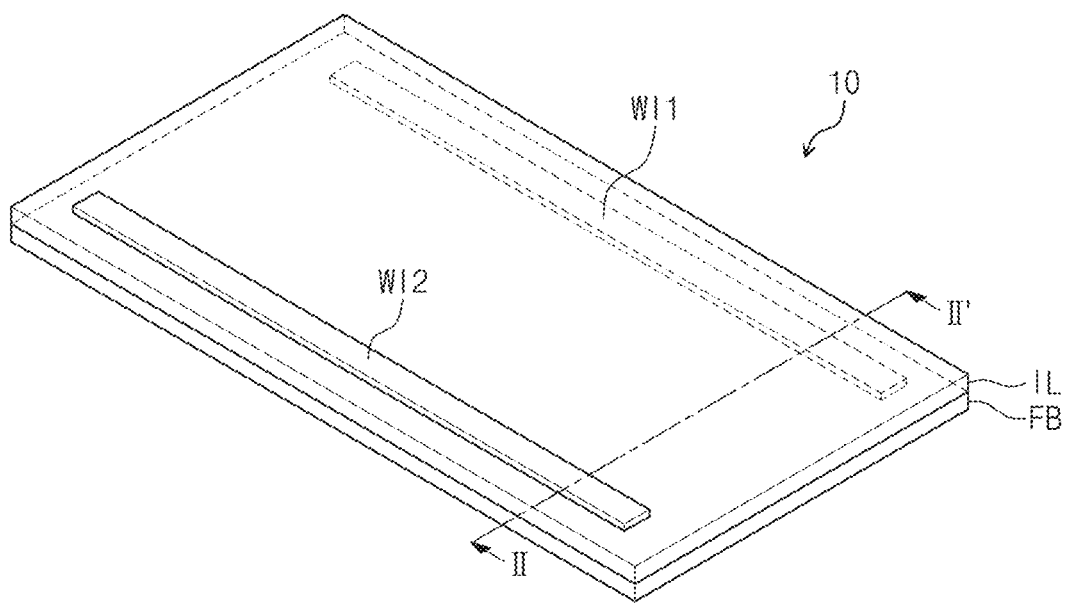
FIG. 4A is a perspective view showing a flexible display device according to an exemplary embodiment of the present disclosure.
Figure 4B:
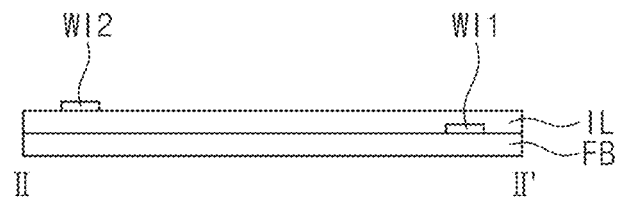
FIG. 4B is a cross-sectional view taken along a line II-II' of FIG. 4A.
Figure 4C:
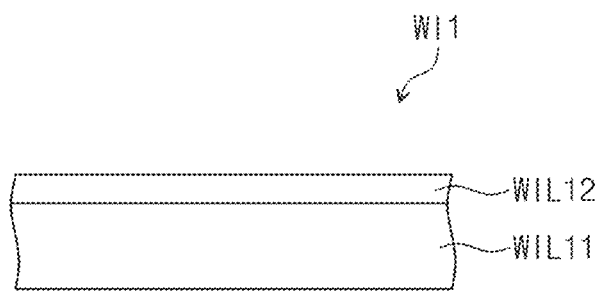
FIGS. 4C and 4D are cross-sectional views a first line included in a flexible display device according to an exemplary embodiment of the present disclosure.
Figure 4D:
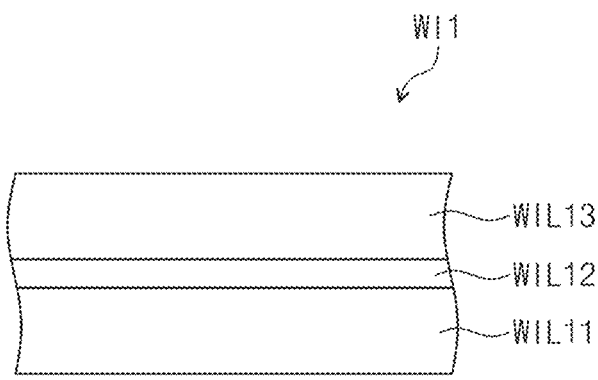
Figure 4E:
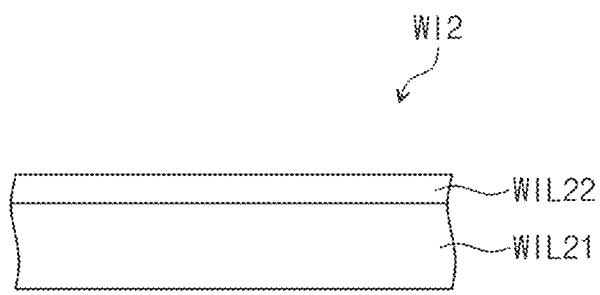
FIGS. 4E and 4F are cross-sectional views a second line included in a flexible display device according to an exemplary embodiment of the present disclosure.
Figure 4F:
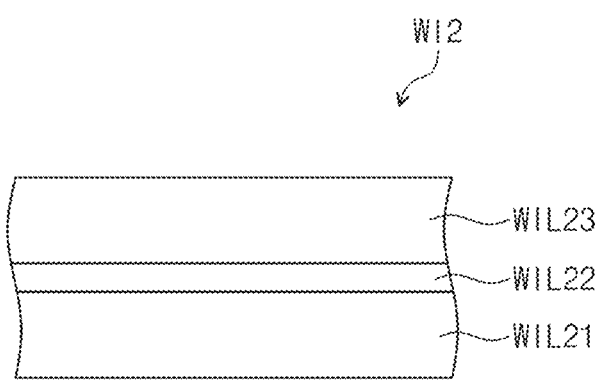

FIG. 4A is a perspective view showing a flexible display device according to an exemplary embodiment of the present disclosure. FIG. 4B is a cross-sectional view taken along a line II-IP of FIG. 4A. FIGS. 4C and 4D are cross-sectional views a first line included in a flexible display device according to an exemplary embodiment of the present disclosure. FIGS. 4E and 4F are cross-sectional views a second line included in a flexible display device according to an exemplary embodiment of the present disclosure.

Referring to FIGS. 4A, 4B, 4C, 4D, 4E, and 4F, a wiring WI may include a first wiring WI1 and a second wiring WI2. An insulating layer IL may be disposed between the first wiring WI1 and the second wiring WI2. The first wiring WI1 may be disposed between the flexible substrate FB and the insulating layer IL, and the second wiring WI2 may be disposed on the insulating layer IL. The insulating layer IL may include an organic insulating material or an inorganic insulating material, but it should not be limited thereto or thereby.

Referring to FIGS. 4A, 4B, and 4C, the first wiring WI1 may include a plurality of sub-wiring layers. The first wiring WI1 may include two, three, four, five, or six sub-wiring layers, but it should not be limited thereto or thereby. That is, the first wiring WI1 may include seven or more sub-wiring layers. Referring to FIG. 4D, the second wiring WI2 may include a plurality of sub-wiring layers. The second wiring WI2 may include two, three, four, five, or six sub-wiring layers, but it should not be limited thereto or thereby. That is, the second wiring WI2 may include seven or more sub-wiring layers.

The first wiring WI1 may include a first sub-wiring layer WIL11 and a second sub-wiring layer WIL12. The first sub-wiring layer WIL11 may include first grains each having a first grain size. The first sub-wiring layer WIL11 may include a first material. The second sub-wiring layer WIL12 may be disposed on the first sub-wiring layer WIL11. The second sub-wiring layer WIL12 may include second grains each having a second grain size. The second sub-wiring layer WIL12 may include a second material. The second material may be different from the first material. The second sub-wiring layer WIL12 may have a thickness smaller than that of the first sub-wiring layer WIL11.

The first wiring WI1 may further include a third sub-wiring layer WIL13. The third sub-wiring layer WIL13 may include third grains each having a third grain size. The third sub-wiring layer WIL13 may include a third material. The third material may be different from the second material. The third material may be equal to or different from the first material. The third sub-wiring layer WIL13 may have a thickness greater than that of the second sub-wiring layer WIL12.

Referring to FIGS. 4A, 4E, and 4F, the second wiring WI2 may include a fourth sub-wiring layer WIL21 and a fifth sub-wiring layer WIL22. The fourth sub-wiring layer WIL21 may include the first grains each having a first grain size. The fourth sub-wiring layer WIL21 may include the first material. The fifth sub-wiring layer WIL22 may be disposed on the fourth sub-wiring layer WIL21. The fifth sub-wiring layer WIL22 may include the second grains each having the second grain size. The fifth sub-wiring layer WIL22 may include the second material. The second material may be different from the first material. The fifth sub-wiring layer WIL22 may have a thickness smaller than that of the fourth sub-wiring layer WIL21.

The second wiring WI2 may further include a sixth sub-wiring layer WIL23. The sixth sub-wiring layer WIL23 may include the third grains each having the third grain size. The sixth sub-wiring layer WIL23 may include the third material. The third material may be different from the second material. The third material may be equal to or different from the first material. The sixth sub-wiring layer WIL23 may have a thickness greater than that of the fifth sub-wiring layer WIL22.

Figure 5A:
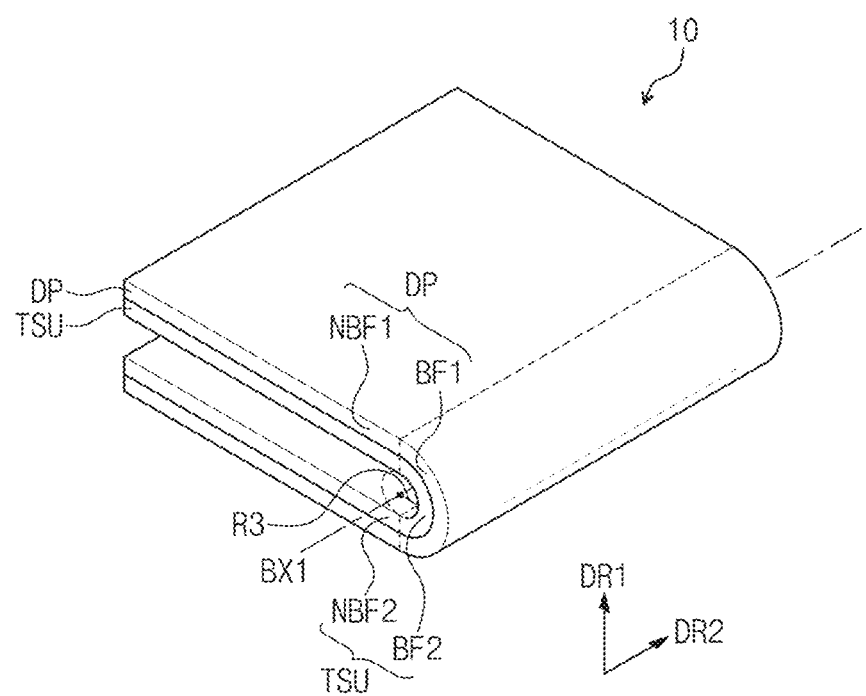
FIGS. 5A, 5B, and 5C are perspective views showing a flexible display device according to an exemplary embodiment of the present disclosure.
Figure 5B:
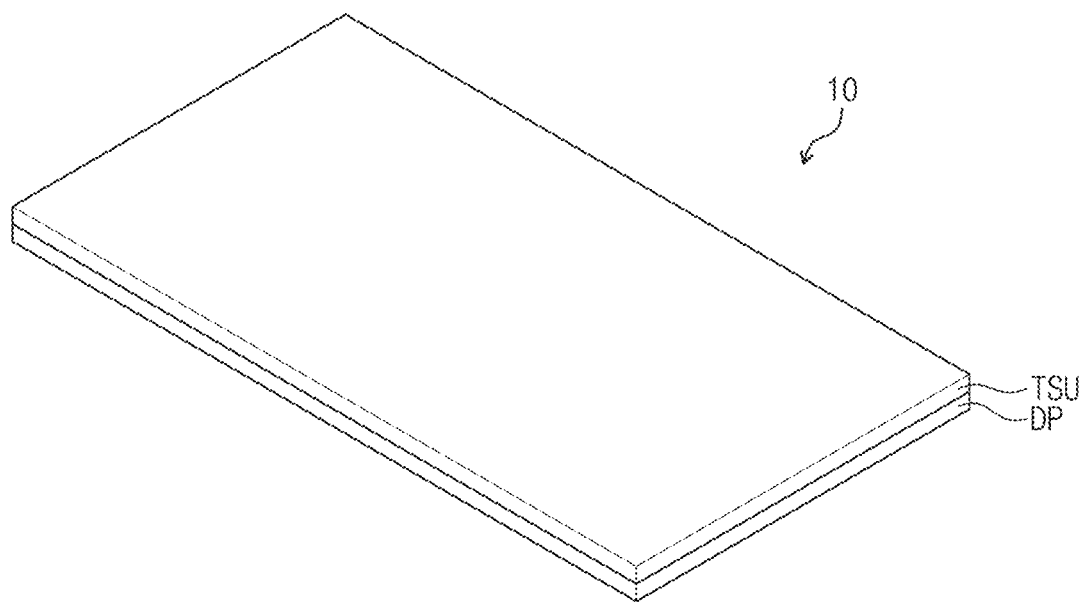
Figure 5C:
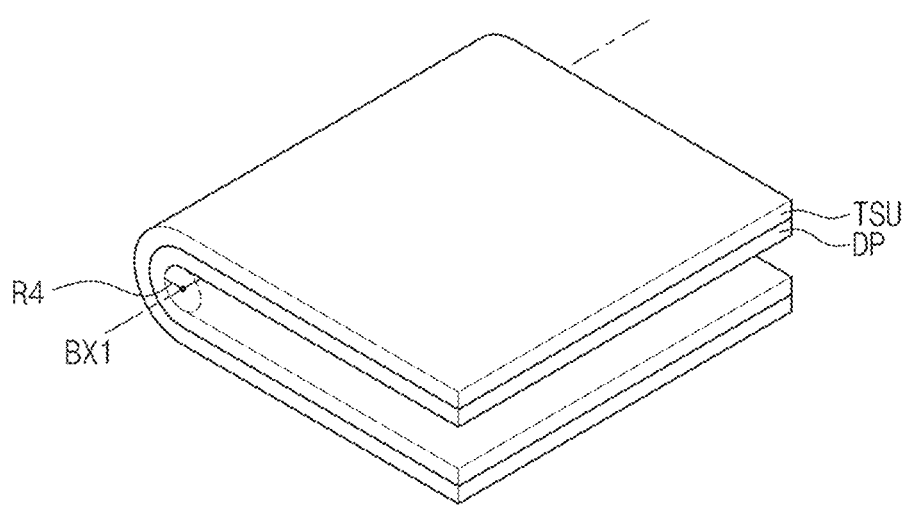

FIGS. 5A, 5B, and 5C are perspective views showing a flexible display device according to an exemplary embodiment of the present disclosure.

Referring to FIGS. 5A, 5B, and 5C, the flexible display device 10 may be operated in the first mode or the second mode. The flexible display device 10 may include the touch sensing unit TSU and the flexible display panel DP. The touch sensing unit TSU may be disposed on the flexible display panel DP in the first direction DR1.

The touch sensing unit TSU may include a touch bending part BF2 and a touch non-bending part NBF2. The touch bending part BF2 may be bent in the first mode with respect to a bending axis BX1 extending in the second direction DR2 and may be stretched in the second mode. The touch bending part BF2 may be connected to the touch non-bending part NBF2. The touch non-bending part NBF2 may be not bent in the first and second modes.

The flexible display panel DP may include a panel bending part BF1 and a panel non-bending part NBF1. The panel bending part BF1 may be bent in the first mode with respect to the bending axis BX1 extending in the second direction DR2 and may be stretched in the second mode. The panel bending part BF1 may be connected to the panel non-bending part NBF1. The panel non-bending part NBF1 may be not bent in the first and second modes.

Referring to FIGS. 5A, 5B, and 5C, at least a portion of the touch sensing unit TSU and the flexible display panel DP may be bent in the first mode. Referring to FIG. 5B, the touch bending part BF2 of the touch sensing unit TSU and the panel bending part BF1 of the flexible display panel DP are stretched in the second mode.

The first mode may include a first bending mode and a second bending mode. Referring to FIG. 5A, the flexible display device 10 may be bent in one direction with respect to the bending axis BX1 in the first bending mode. The flexible display device 10 may be inwardly bent in the first bending mode. When the flexible display device 10 is in the inner-bending state, a distance between portions facing each other of the touch sensing unit TSU after the touch sensing unit TSU is bent may be shorter than a distance between portions facing each other of the flexible display panel DP after the flexible display panel DP may be bent. In the inner-bending state, a surface of the touch bending part BF2 of the touch sensing unit TSU may have a third radius of curvature R3. The third radius of curvature R3 may be equal to or greater than about 1 mm and equal to or smaller than about 10 mm.

Referring to FIG. 5C, the flexible display device 10 may be bent in a direction opposite to the one direction of FIG. 5A with respect to the bending axis BX1 in the second bending mode. The flexible display device 10 may be outwardly bent in the second bending mode. When the flexible display device 10 is in the outer-bending state, a distance between portions facing each other of the flexible display panel DP after the flexible display panel DP is bent may be shorter than a distance between portions facing each other of the touch sensing unit TSU after the touch sensing unit TSU is bent. In the outer-bending state, a surface of the panel bending part BF1 of the flexible display panel DP may have a fourth radius of curvature R4. The fourth radius of curvature R4 may be equal to or greater than about 1 mm and equal to or smaller than about 10 mm.

Referring to FIGS. 1A, 1B, 1C, 2A, 2B, 5A, 5B, and 5C, at least one of the flexible display panel DP and the touch sensing unit TSU may include the conductive pattern CP. The conductive pattern CP may be included in at least one of the panel bending part BF1 and the touch bending part BF2.

The conductive pattern CP may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material.

The conductive pattern CP may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

Figure 6A:
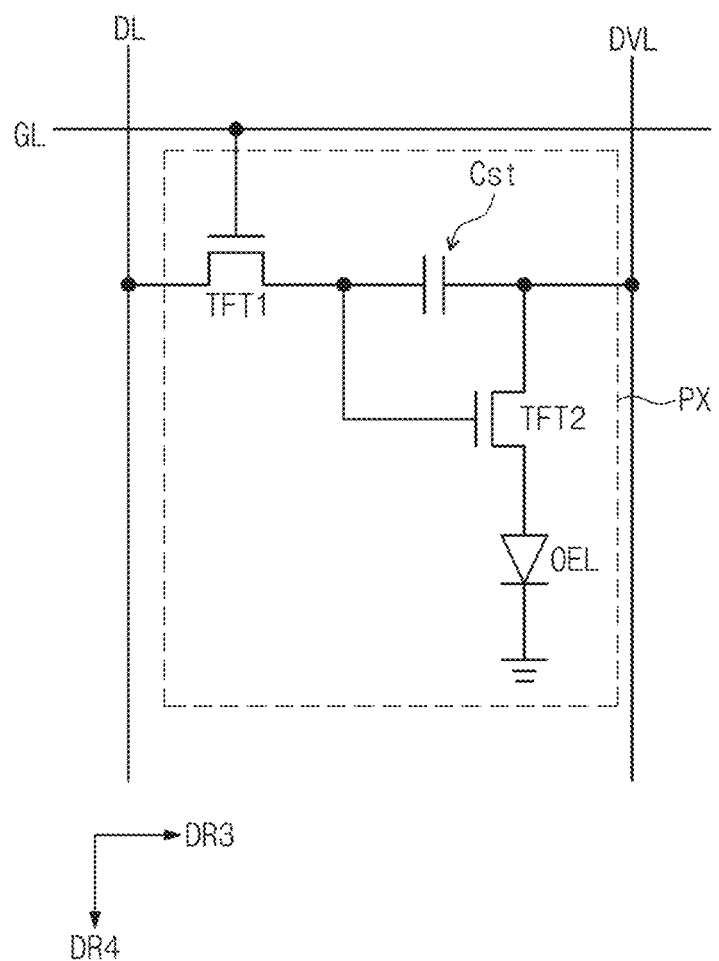
FIG. 6A is a circuit diagram showing one pixel among pixels included in a flexible display device according to an exemplary embodiment of the present disclosure.
Figure 6B:
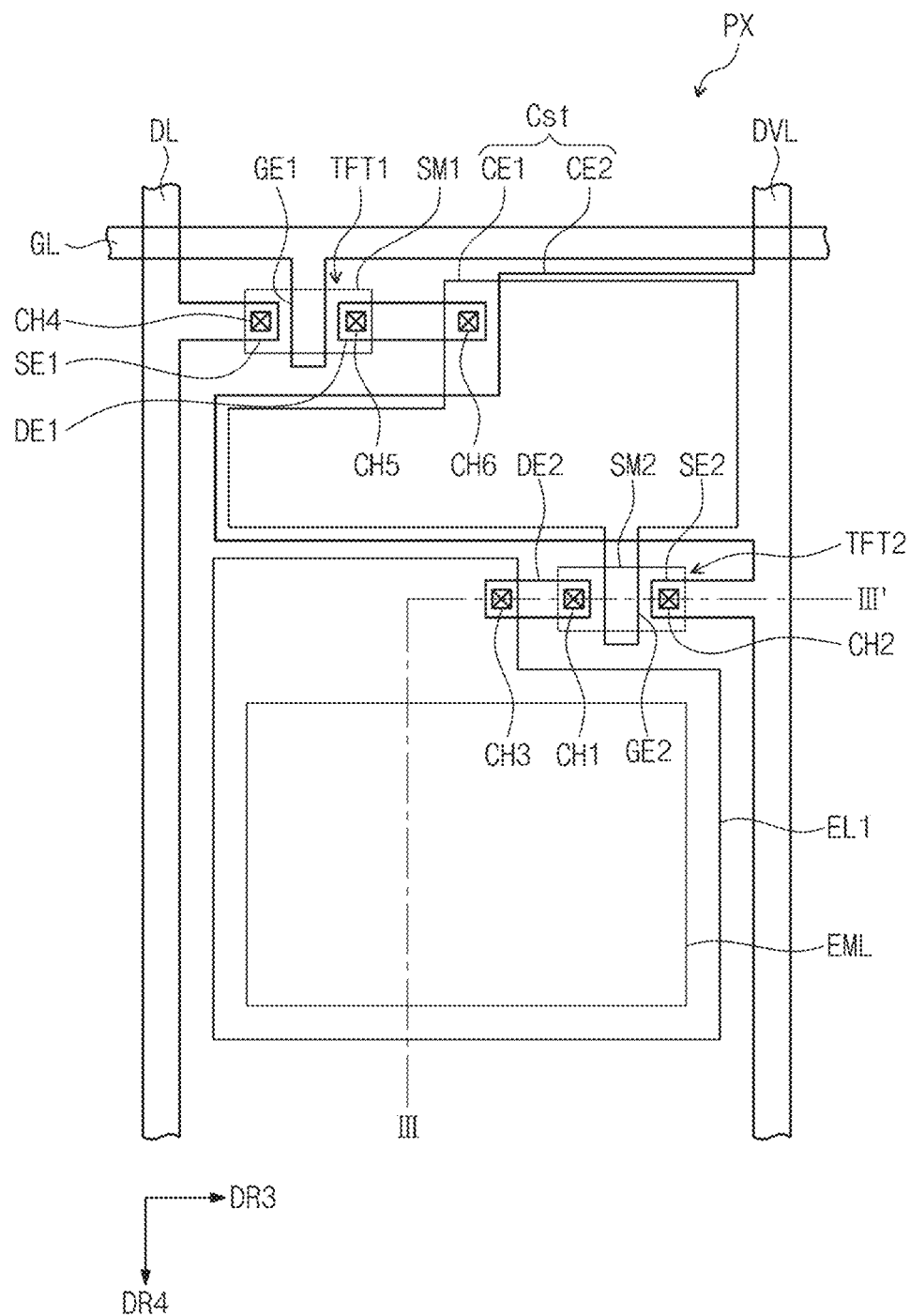
FIG. 6B is a plan view showing one pixel among pixels included in a flexible display device according to an exemplary embodiment of the present disclosure.
Figure 6C:
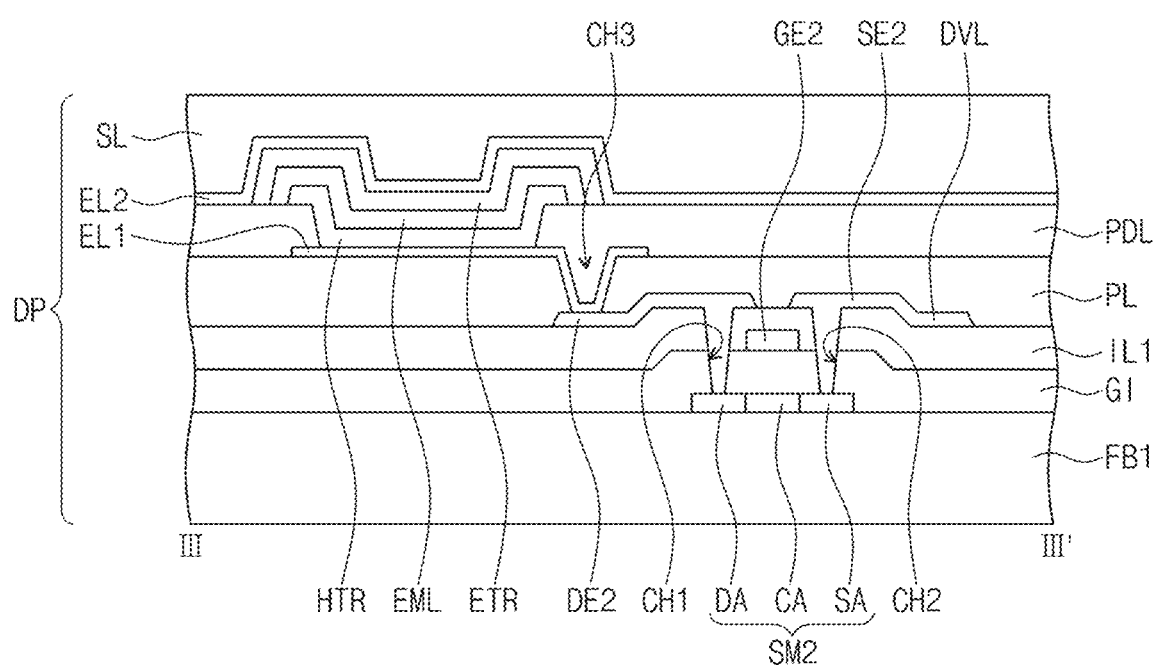
FIG. 6C is a cross-sectional view taken along a line of FIG. 6B.

FIG. 6A is a circuit diagram showing one pixel among pixels included in a flexible display device according to an exemplary embodiment of the present disclosure. FIG. 6B is a plan view showing one pixel among pixels included in a flexible display device according to an exemplary embodiment of the present disclosure. FIG. 6C is a cross-sectional view taken along a line of FIG. 6B.

Hereinafter, an organic light emitting display panel will be described as the flexible display panel DP, but the flexible display panel DP should not be limited to the organic light emitting display panel. That is, the flexible display panel DP may be a liquid crystal display panel, a plasma display panel, an electrophoretic display panel, a microelectromechanical system display panel, or an electrowetting display panel.

Referring to FIGS. 1A, 1B, 1C, 2A, 2B, 5A, 5B, 5C, 6A, and 6B, the flexible display panel DP may include the flexible substrate FB and the conductive pattern CP disposed on the flexible substrate FB. At least a portion of the conductive pattern CP may be included in the panel bending part BF1. The conductive pattern CP may be included in the panel bending part BF1 and may not be included in the panel non-bending part NBF1. The conductive pattern CP may be included in each of the panel bending part BF1 and the panel non-bending part NBF1.

The conductive pattern CP may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material.

The conductive pattern CP may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

At least one of gate lines GL, data lines DL, driving voltage lines DVL, a switching thin film transistor TFT1, a driving thin film transistor TFT2, a capacitor Cst, a first semiconductor pattern SM1, a second semiconductor pattern SM2, a first electrode EL1, and a second electrode EL2, which are described below, may be the conductive pattern CP. The driving thin film transistor TFT2 may include a second gate electrode GE2, a second source electrode SE2, and a second drain electrode DE2. The capacitor Cst may include a first common electrode CE1 and a second common electrode CE2.

Referring to FIGS. 1A to 1C, 2A, 2B, 6A, and 6B, each pixel PX may be connected a line part including the gate lines GL, the data lines DL, and the driving voltage lines DVL. Each pixel PX may include the thin film transistors TFT1 and TFT2 connected to the line part and an organic light emitting element OEL connected to the thin film transistors TFT1 and TFT2, and the capacitor Cst.

In the present exemplary embodiment, one pixel may be connected to one gate line, one data line, and one driving voltage line, but it should not be limited thereto or thereby. That is, a plurality of pixels may be connected to one gate line, one data line, and one driving voltage line. In addition, one pixel may be connected to at least one gate line, at least one data line, and at least one driving voltage line.

The gate lines GL extend in a third direction DR3. The data lines DL extend in a fourth direction DR4 to cross the gate lines GL. The driving voltage lines DVL extend in the same direction, i.e., the fourth direction DR4, as the data lines DL. The gate lines GL apply scan signals to the thin film transistors TFT1 and TFT2, the data lines DL apply data signals to the thin film transistors TFT1 and TFT2, and the driving voltage lines DVL apply driving voltages to the thin film transistors TFT1 and TFT2.

At least one of the gate lines GL, the data lines DL, and the driving voltage lines DVL may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material.

At least one of the gate lines GL, the data lines DL, and the driving voltage lines DVL may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

Each of the pixels PX may emit a light with a specific color, e.g., a red light, a green light, or a blue light, but the color of the light should not be limited thereto or thereby. For instance, each pixel may emit a white color, a cyan light, a magenta light, or a yellow light.

The thin film transistors TFT1 and TFT2 may include the driving thin film transistor TFT2 to control the organic light emitting element OEL and the switching thin film transistor TFT1 to switch the driving thin film transistor TFT2. In the present exemplary embodiment, each pixel PX may include two thin film transistors TFT1 and TFT2, but the number of the transistors included in each pixel PX should not be limited to two. That is, each pixel PX may include one thin film transistor and a capacitor or may include three or more thin film transistors and two or more capacitors.

At least one of the switching thin film transistor TFT1, the driving thin film transistor TFT2, and the capacitor Cst may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material.

At least one of the switching thin film transistor TFT1, the driving thin film transistor TFT2, and the capacitor Cst may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

The switching thin film transistor TFT1 may include a first gate electrode GE1, a first source electrode SE1, and a first drain electrode DE1. The first gate electrode GE1 may be connected to the gate lines GL, and the first source electrode SE1 may be connected to the data lines DL. The first drain electrode DE1 may be connected to the first common electrode CE1 through a fifth contact hole CH5. The switching thin film transistor TFT1 applies the data signal provided through the data lines DL to the driving thin film transistor TFT2 in response to the scan signal provided through the gate lines GL.

At least one of the first gate electrode GE1, the first source electrode SE1, and the first drain electrode DE1 may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material.

At least one of the first gate electrode GE1, the first source electrode SE1, and the first drain electrode DE1 may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

The driving thin film transistor TFT2 may include the second gate electrode GE2, the second source electrode SE2, and the second drain electrode DE2. The second gate electrode GE2 may be connected to the first common electrode CE1. The second source electrode SE2 may be connected to the driving voltage lines DVL. The second drain electrode DE2 may be connected to the first electrode EL1 through a third contact hole CH3.

At least one of the second gate electrode GE2, the second source electrode SE2, and the second drain electrode DE2 may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material.

At least one of the second gate electrode GE2, the second source electrode SE2, and the second drain electrode DE2 may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

The first electrode EL1 may be connected to the second drain electrode DE2 of the driving thin film transistor TFT2. The second electrode may be applied with a common voltage and a light emitting layer EML emits the blue light in response to an output signal from the driving thin film transistor TFT2 to display an image. The first and second electrodes EL1 and EL2 will be described in detail later.

The capacitor Cst may be connected between the second gate electrode GE2 and the second source electrode SE2 of the driving thin film transistor TFT2 and may be charged with the data signal applied to the second gate electrode GE2 of the driving thin film transistor TFT2. The capacitor Cst may include the first common electrode CE1 connected to the first drain electrode DE1 through a sixth contact hole CH6 and the second common electrode CE2 connected to the driving voltage lines DVL.

At least one of the first common electrode CE1 and the second common electrode CE2 may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material.

At least one of the first common electrode CE1 and the second common electrode CE2 may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

Referring to FIGS. 6A, 6B, and 6C, a first flexible substrate FB1 may include, but is not limited to, a plastic material or an organic polymer, e.g., polyethylene terephthalate (PET), polyethylene naphthalate (PEN), polyimide, polyether sulfone, etc. The material for the first flexible substrate FB1 may be selected in consideration of a mechanical strength, a thermal stability, a transparency, a surface smoothness, an ease of handling, a water repellency, etc. The first flexible substrate FB may be transparent.

A substrate buffer layer (not shown) may be disposed on the first flexible substrate FB1. The substrate buffer layer may prevent impurities from being diffused into the switching thin film transistor TFT1 and the driving thin film transistor TFT2. The substrate buffer layer may be formed of silicon nitride (SiNx), silicon oxide (SiOx), or silicon oxynitride (SiOxNy) and omitted depending on a material and a process condition of the first flexible substrate FB1.

A first semiconductor pattern SM1 and a second semiconductor pattern SM2 may be disposed on the first flexible substrate FB1. The first and second semiconductor patterns SM1 and SM2 may be formed of a semiconductor material and operated as active layers of the switching thin film transistor TFT1 and the driving thin film transistor TFT2, respectively. Each of the first and second semiconductor patterns SM1 and SM2 may include a source part SA, a drain part DA, and a channel part CA disposed between the source part SA and the drain part DA. Each of the first and second semiconductor patterns SM1 and SM2 may be formed of an inorganic semiconductor or an organic semiconductor. The source part SA and the drain part DA are doped with an n-type impurity or a p-type impurity.

At least one of the first semiconductor pattern SM1 and the second semiconductor pattern SM2 may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material.

At least one of the first semiconductor pattern SM1 and the second semiconductor pattern SM2 may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

A gate insulating layer GI may be disposed on the first and second semiconductor patterns SM1 and SM2. The gate insulating layer GI may cover the first and second semiconductor patterns SM1 and SM2. The gate insulating layer GI may include an organic insulating material or an inorganic insulating material.

The first and second gate electrodes GE1 and GE2 may be disposed on the gate insulating layer GI. The first and second gate electrodes GE1 and GE2 may be disposed to respectively cover portions corresponding to the drain parts DA of the first and second semiconductor patterns SM1 and SM2.

A first insulating layer IL1 may be disposed on the first and second gate electrodes GE1 and GE2. The first insulating layer IL1 may cover the first and second gate electrodes GE1 and GE2. The first insulating layer IL1 may include an organic insulating material or an inorganic insulating material.

The first source electrode SE1, the first drain electrode DE1, the second source electrode SE2, and the second drain electrode DE2 may be disposed on the first insulating layer IL1. The second drain electrode DE2 may make contact with the drain part DA of the second semiconductor pattern SM2 through a first contact hole CH1 formed through the gate insulating layer GI and the first insulating layer ILL and the second source electrode SE2 makes contact with the source part SA of the second semiconductor pattern SM2 through a second contact hole CH2 formed through the gate insulating layer GI and the first insulating layer IL1. The first source electrode SE1 may make contact with the source part (not shown) of the first semiconductor pattern SM1 through a fourth contact hole CH4 formed through the gate insulating layer GI and the first insulating layer ILL and the first drain electrode DE1 makes contact with the drain part (not shown) of the first semiconductor pattern SM1 through a fifth contact hole CH5 formed through the gate insulating layer GI and the first insulating layer IL1.

A passivation layer PL may be disposed on the first source electrode SE1, the first drain electrode DE1, the second source electrode SE2, and the drain electrode DE2. The passivation layer PL serves as a protective layer to protect the switching thin film transistor TFT1 and the driving thin film transistor TFT2 or as a planarization layer to planarize an upper surface of the switching thin film transistor TFT1 and the driving thin film transistor TFT2.

The first electrode EL1 may be disposed on the passivation layer PL. The first electrode EL1 may be a positive electrode. The first electrode EL1 may be connected to the second drain electrode DE2 of the driving thin film transistor TR2 through a third contact hole CH3 formed through the passivation layer PL.

A pixel definition layer PDL may be disposed on the passivation layer PL to divide the light emitting layer EML to correspond to each of the pixel PX. The pixel definition layer PDL may expose an upper surface of the first electrode EL1 and may be protruded from the first flexible substrate FB1. The pixel definition layer PDL may include, but is not limited to, metal-fluoride ionic compounds, e.g., LiF, $BaF_2$, or CsF. The metal-fluoride ionic compounds may have an insulating property when the metal-fluoride ionic compounds have a predetermined thickness. The pixel definition layer PDL may have a thickness equal to or greater than about 10 nm and equal to or smaller than about 100 nm. The pixel definition layer PDL will be described in detail later.

The organic light emitting element OEL may be provided in the area surrounding by the pixel definition layer PDL. The organic light emitting layer OEL may include the first electrode EL1, a hole transport region HTR, the light emitting layer EML, an electron transport region ETR, and the second electrode EL2.

The first electrode EL1 may have conductivity. The first electrode EL1 may be a pixel electrode or a positive electrode. The first electrode EL1 may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material. The first electrode EL1 may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

The first electrode EL1 may be a transmissive electrode, a transflective electrode, or a reflective electrode. When the first electrode EL1 may be the transmissive electrode, the first electrode EL1 may include a transparent metal oxide, e.g., indium tin oxide (ITO), indium zinc oxide (IZO), zinc oxide (ZnO), indium tin zinc oxide (ITZO), etc. When the first electrode EL1 may be the transflective electrode or the reflective electrode, the first electrode EL1 may include at least one of Al, Cu, Ti, Mo, Ag, Mg, Pt, Pd, Au, Ni, Nd, Ir, and Cr.

An organic layer may be disposed on the first electrode EL1. The organic layer may include the light emitting layer EML. The organic layer may further include the hole transport region HTR and the electrode transport region ETR.

The hole transport region HTR may be disposed on the first electrode EL1. The hole transport region HTR may include at least one of a hole injection layer, a hole transport layer, a buffer layer, and an electron block layer.

The hole transport region HTR may have a single-layer structure of a single material, a single-layer structure of different materials, or a multi-layer structure of a plurality of layers of different materials.

For instance, the hole transport region HTR may have a structure in which single layers formed of different materials from each other are stacked one on another or a structure of the hole injection layer/the hole transport layer, the hole injection layer/the hole transport layer/the buffer layer, the hole injection layer/the buffer layer, the hole transport layer/ the buffer layer, or the hole injection layer/the hole transport layer/the electron block layer.

The hole transport region HTR may be formed using various methods, e.g., a vacuum deposition method, a spin coating method, a casting method, a Langmuir-Blodgett method, an inkjet printing method, a laser printing method, a laser induced thermal image (LITI) method, etc.

When the hole transport region HTR may include the hole injection layer, the hole transport region HTR may include, but is not limited to, a phthalocyanine compound such as copper phthalocyanine, DNTPD (N,N'-diphenyl-N,N'-bis-[4-(phenyl-m-tolyl-amino)-phenyl]-biphenyl-4,4'-diamine), m-MTDATA(4,4',4"-tris(3-methylphenylphenylamino) triphenylamine), TDATA(4,4'4"-Tris(N,N-diphenylamino)triphenylamine), 2TNATA(4,4',4"-tris{N,-(2-naphthyl)-N-phenylamino}-triphenylamine), PEDOT/PSS(Poly(3,4-ethylenedioxythiophene)/Poly(4-styrenesulfonate), PANI/DBSA(Polyaniline/Dodecylbenzenesulfonic acid), PANI/CSA(Polyaniline/Camphor sulfonicacid), PANI/PSS ((Polyaniline)/Poly(4-styrenesulfonate), etc.

When the hole transport region HTR may include the hole transport layer, the hole transport region HTR may include, but is not limited to, carbazole-based derivatives, e.g., n-phenyl carbazole, polyvinyl carbazole, etc., fluorine-based derivatives, triphenylamine-based derivatives, e g TPD(N, N'-bis(3-methylphenyl)-N,N'-diphenyl-[1,1-biphenyl]-4,4'-diamine), TCTA(4,4',4"-tris(N-carbazolyl)triphenylamine), etc., NPB(N,N'-di(1-naphthyl)-N,N'-diphenylbenzidine), TAPC(4,4'-Cyclohexylidene bis[N,N-bis(4-methylphenyl) benzenamine]), etc.

The hole transport region HTR may further include an electric charge generating material. The electric charge generating material may be uniformly or non-uniformly distributed in the hole transport region HTR. The electric charge generating material may be, but is not limited to, a p-dopant. The p-dopant may be one of a quinone derivative, a metal oxide material, and a compound containing a cyano group, but it should not be limited thereto or thereby. For instance, the p-dopant may include the quinone derivatives, such as TCNQ(Tetracyanoquinodimethane), F4-TCNQ(2,3, 5,6-tetrafluoro-tetracyanoquinodimethane), etc., or the metal oxide material, such as a tungsten oxide material, a molybdenum oxide material, etc., but it should not be limited thereto or thereby.

The light emitting layer EML may be disposed on the hole transport region HTR. The light emitting layer EML may include a light emitting material with red, green, and blue colors and may include a fluorescent material or a phosphorescent material. In addition, the light emitting layer EML may include a host and a dopant.

As the host, for example, Alq3(tris(8-hydroxyquinolino) aluminum), CBP(4,4'-bis(N-carbazolyl)-1,1'-biphenyl), PVK(poly(n-vinylcabazole), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl) benzene), TBADN(3-tert-butyl-9,10-di(naphth-2-yl) anthracene), DSA(distyrylarylene), CDBP(4,4'-bis(9-carbazolyl)-2,2"-dimethyl-biphenyl), MADN(2-Methyl-9, 10-bis(naphthalen-2-yl)anthracene) may be used, however, it should not be limited thereto or thereby.

When the light emitting layer EML emits the light having the red color, the light emitting layer EML, for example, may include the fluorescent material including PBD:Eu (DBM)3(Phen)(tris(dibenzoylmethanato)phenanthoroline europium) or perylene. When the light emitting layer EML emits the light having the red color, the dopant included in the light emitting layer EML may be selected from a metal complex, such as PIQIr(acac)(bis(1-phenylisoquinoline) acetylacetonate iridium), PQIr(acac)(bis(1-phenylquinoline) acetylacetonate iridium), PQIr(tris(1-phenylquinoline) iridium), PtOEP(octaethylporphyrin platinum), etc., or organometallic complex.

When the light emitting layer EML emits the light having the green color, the light emitting layer EML, for example, may include the fluorescent material including Alq3(tris(8-hydroxyquinolino)aluminum). When the light emitting layer EML emits the light having the green color, the dopant included in the light emitting layer EML may be selected from a metal complex, such as Ir(ppy)3(fac-tris(2-phenylpyridine)iridium), or organometallic complex.

When the light emitting layer EML emits the light having the blue color, the light emitting layer EML, for example, may include the fluorescent material including any one selected from the groups consisting of spiro-DPVBi, spiro-6P, DSB(distyryl-benzene), DSA(distyryl-arylene), PFO (Polyfluorene)-based polymer, and PPV(poly(p-phenylene vinylene)-based polymer. When the light emitting layer EML emits the light having the blue color, the dopant included in the light emitting layer EML may be selected from a metal complex, such as (4,6-F2ppy)2Irpic, or organometallic complex. The light emitting layer EML will be described in detail later.

The electron transport region ETR may be disposed on the light emitting layer EML. The electron transport region ETR may include at least one of a hole block layer, an electron transport layer, and an electron injection layer, but it should not be limited thereto or thereby.

When the electron transport region ETR may include the electron transport layer, the electron transport region ETR may include Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), Bebq2(berylliumbis (benzoquinolin-10-olate), ADN(9,10-di(naphthalene-2-yl) anthracene), or a compound thereof. The electron transport layer may have a thickness equal to or greater than about 100 angstroms and equal to or smaller than about 1000 angstroms, more preferably, equal to or greater than about 150 angstroms and equal to or smaller than about 500 angstroms. When the thickness of the electron transport layer is in the above-mentioned range, satisfactory electron transport property may be secured without increasing the driving voltage.

When the electron transport region ETR may include the electron injection layer, the electron transport region ETR may include a lanthanide-based metal, e.g., LiF, LiQ (Lithium quinolate), Li$_2$O, BaO, NaCl, CsF, Yb, etc., or a metal halide, e.g., RbCl, RbI, etc., but it should not be limited thereto or thereby. The electron transport layer may include a mixture of an electron transport material and an organo metal salt with insulating property. The organo metal salt may have an energy band gap of about 4 eV or more. In detail, the organo metal salt may include metal acetate, metal benzoate, metal acetoacetate, metal acetylacetonate, or metal stearate. The electron injection layer may have a thickness of about 1 angstroms to about 100 angstroms, but more preferably, about 3 angstroms to about 90 angstroms. When the thickness of the electron injection layer is in the above-mentioned range, satisfactory electron injection property may be secured without increasing the driving voltage.

As described above, the electron transport region ETR may include the hole block layer. The hole block layer include at least one of BCP(2,9-dimethyl-4,7-diphenyl-1,10-phenanthroline) and Bphen(4,7-diphenyl-1,10-phenanthroline), but it should not be limited thereto or thereby.

The second electrode EL2 may be disposed on the electron transport region ETR. The second electrode EL2 may be a common electrode or a negative electrode. The second electrode EL2 may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material. The second electrode EL2 may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

The second electrode EL2 may be a transmissive electrode, a transflective electrode, or a reflective electrode. When the second electrode EL2 may be the transmissive electrode, the second electrode EL2 may include Li, Ca, LiF/Ca, LiF/Al, Al, Mg, BaF, Ba, Ag, a compound thereof, or a mixture thereof, e.g., a mixture of Ag and Mg.

The second electrode EL2 may include an auxiliary electrode. The auxiliary electrode may include a layer obtained by depositing the material to face the light emitting layer EML and a transparent metal oxide may be disposed on the layer, such as indium tin oxide (ITO), indium zinc oxide (IZO), zinc oxide (ZnO), indium tin zinc oxide (ITZO).

When the second electrode EL2 may be the transflective electrode or the reflective electrode, the second electrode EL2 may include Ag, Mg, Cu, Al, Pt, Au, Ni, Nd, Ir, Cr, Li, Ca, LiF/Ca, LiF/Al, Mo, Ti, a compound thereof, or a mixture thereof, e.g., a mixture of Ag and Mg. In addition, the second electrode EL2 may have a multi-layer structure of a reflective layer or a transflective layer formed of the above-mentioned material and a transparent conductive layer formed of indium tin oxide, indium zinc oxide, zinc oxide, or indium tin zinc oxide.

When the organic light emitting element OEL may be a front surface light emitting type, the first electrode EL1 may be the reflective electrode, and the second electrode EL2 may be the transmissive or transflective electrode. When the organic light emitting element OEL is a rear surface light emitting type, the first electrode EL1 may be the transmissive or transflective electrode, and the second electrode EL2 may be the reflective electrode.

When voltages are respectively applied to the first and second electrodes EL1 and EL2 in the organic light emitting element OEL, holes injected from the first electrode EL1 may move to the light emitting layer EML through the hole transport region HTR, and electrons injected from the second electrode EL2 may move to the light emitting layer EML through the electron transport region ETR. The holes and electrons may be recombined in the light emitting layer EML to generate excitons, and the organic light emitting element OEL may emit light by the excitons that return to a ground state from an excited state.

A sealing layer SL may be disposed on the second electrode EL2. The sealing layer SL covers the second electrode EL2. The sealing layer SL may include at least one of an organic layer and an inorganic layer. The sealing layer SL may be a thin sealing layer. The sealing layer SL protects the organic light emitting element OEL.

Figure 7A:
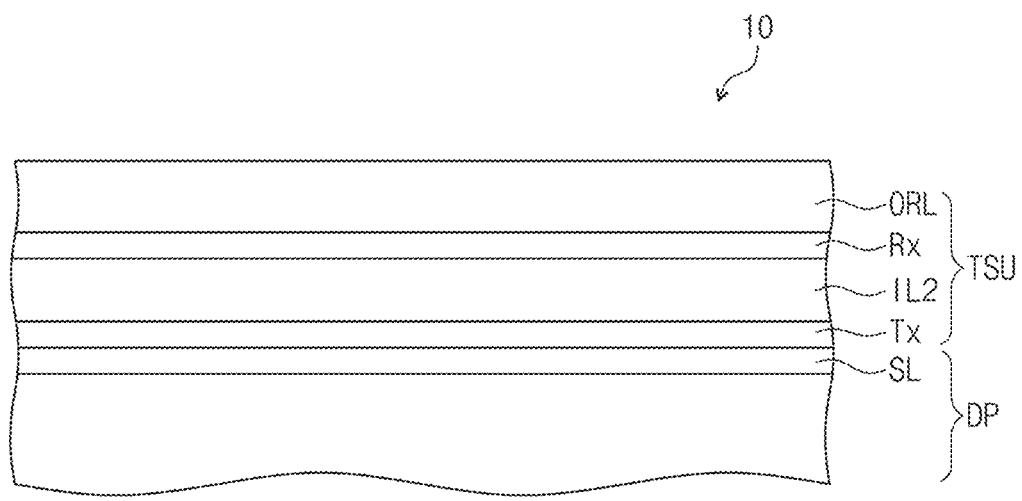
FIG. 7A is a cross-sectional view showing a flexible display device according to an exemplary embodiment of the present disclosure.
Figure 7B:
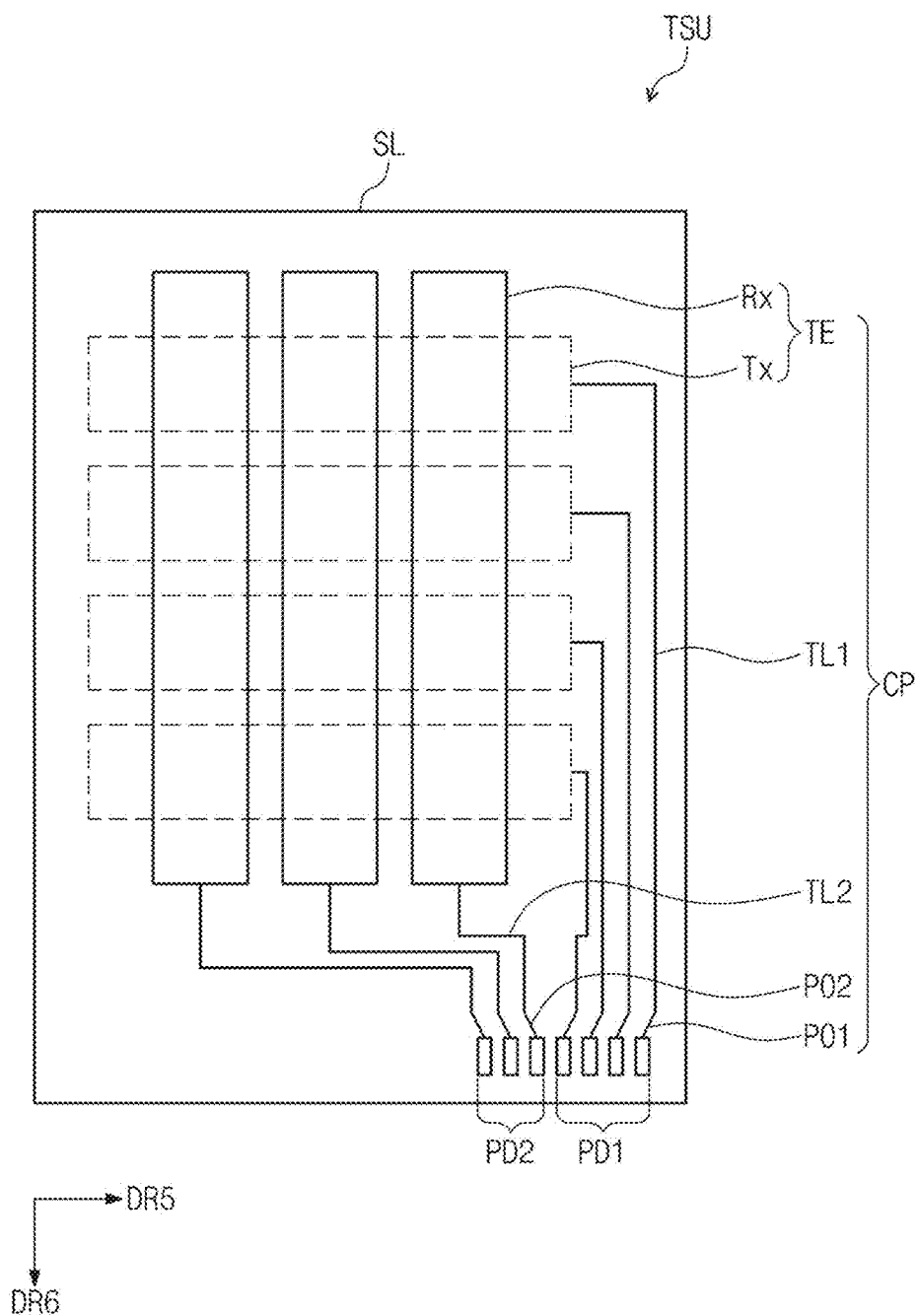
FIG. 7B is a plan view showing a touch sensing unit included in a flexible display device according to an exemplary embodiment of the present disclosure.

FIG. 7A is a cross-sectional view showing a flexible display device according to an exemplary embodiment of the present disclosure. FIG. 7B is a plan view showing a touch sensing unit included in a flexible display device according to an exemplary embodiment of the present disclosure.

Figure 8A:
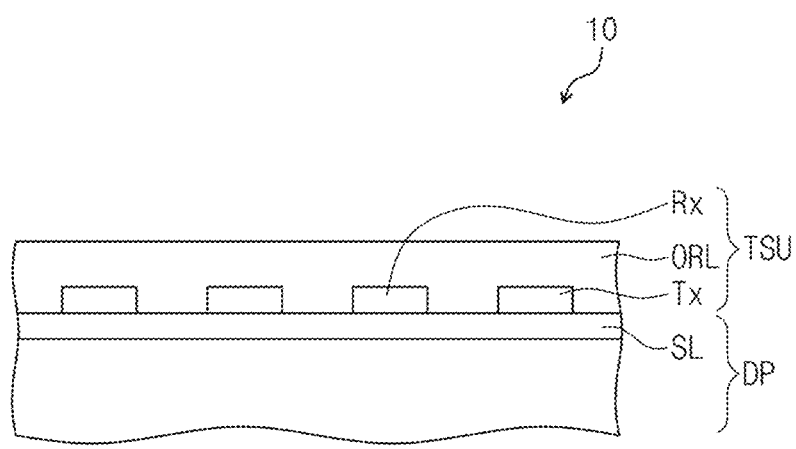
FIG. 8A is a cross-sectional view showing a flexible display device according to an exemplary embodiment of the present disclosure.
Figure 8B:
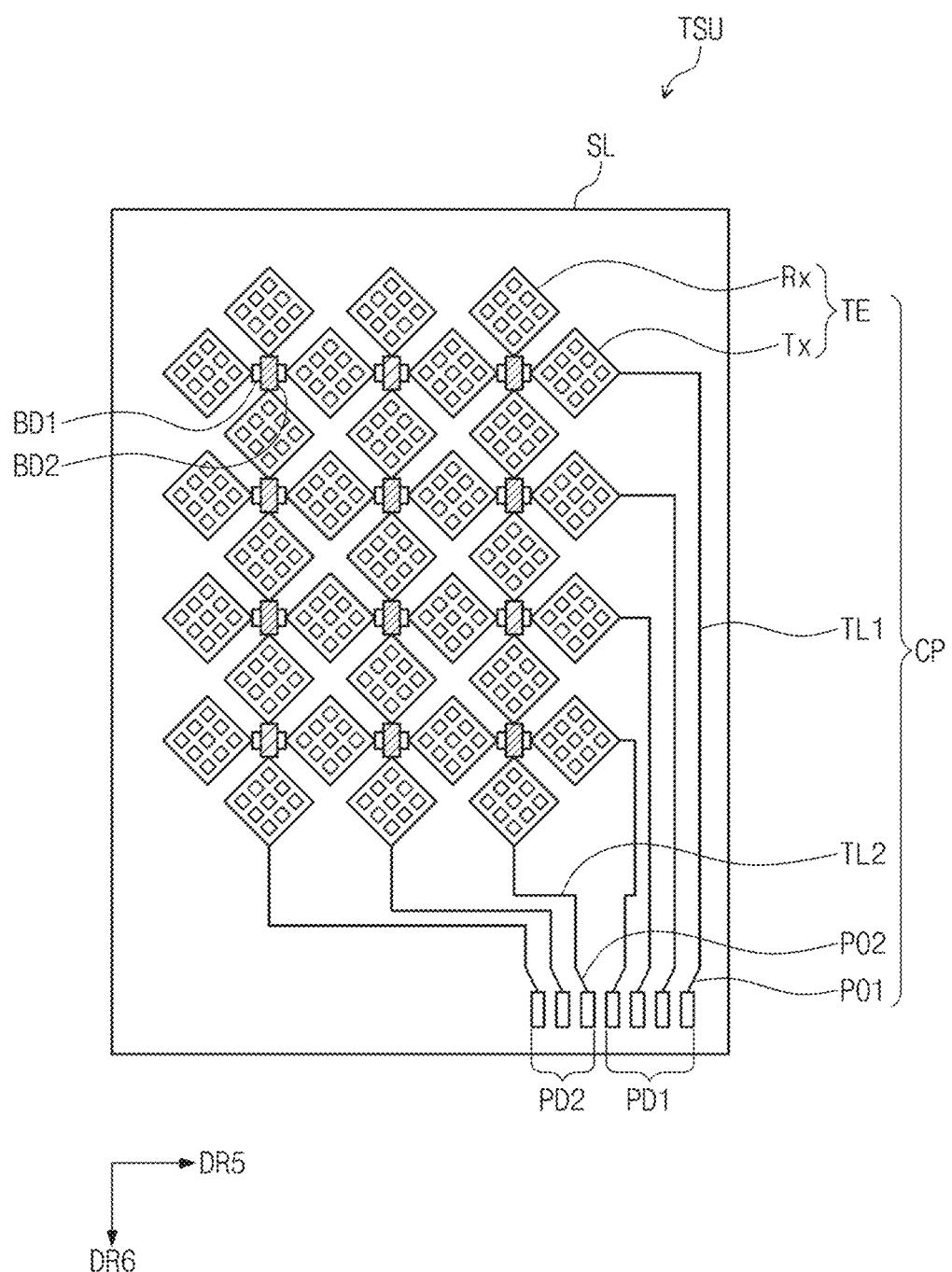
FIG. 8B is a plan view showing a touch sensing unit included in a flexible display device according to an exemplary embodiment of the present disclosure.

FIG. 8A is a cross-sectional view showing a flexible display device according to an exemplary embodiment of the present disclosure. FIG. 8B is a plan view showing a touch sensing unit included in a flexible display device according to an exemplary embodiment of the present disclosure.

Referring to FIGS. 7A, 7B, 8A, and 8B, the touch sensing unit TSU may be disposed on the flexible display panel DP. The touch sensing unit TSU may be disposed on the sealing layer SL. The touch sensing unit TSU may recognize a user's direct touch, a user's indirect touch, an object's direct touch, or an object's indirect touch. The term of "indirect touch" used herein means that the touch sensing unit TSU recognizes the touches even though the touch sensing unit TSU is not touched by the user or object since the user or object is spaced apart from the touch sensing unit TSU by a distance, in which the touch sensing unit TSU recognizes the touch of the user or object.

When the direct or indirect touch occurs, a variation in electrostatic capacitance occurs between first sensing electrodes Tx and second sensing electrodes Rx included in a sensing electrode TE. A sensing signal applied to the first sensing electrodes Tx may be delayed due to the variation of the electrostatic capacitance and then applied to the second sensing electrodes Rx. The touch sensing unit TSU generates a touch coordinate from the delay value of the sensing signal.

In the flexible display device 10 according to the present exemplary embodiment, the touch sensing unit TSU may be operated in an electrostatic capacitive mode, but it should not be limited thereto or thereby. That is, the touch sensing unit TSU may be operated in a resistive film mode, a self-capacitance mode, or a mutual capacitance mode.

Referring to FIGS. 1A, 1B, 1C, 2A, 2B, 5A, 5B, 5C, 7A, 7B, 8A, and 8B, at least part of the conductive pattern CP may be included in the touch bending part BF2. The conductive pattern CP may be included in the touch bending part BF2 and not be included in the touch non-bending part NBF2. The conductive pattern CP may be included in each of the touch bending part BF2 and the touch non-bending part NBF2. The conductive pattern CP may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material. The conductive pattern CP may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

At least one of a sensing electrode TE, a first connection line TL1, a second connection line TL2, a first fan-out line PO1, a second fan-out line PO2, a first bridge BD1, and a second bridge BD2, which will be described in detail later, may be the conductive pattern CP.

The sensing electrode TE may be disposed on the sealing layer SL. Although not shown in figures, an additional flexible substrate may be disposed between the sensing electrode TE and the sealing layer SL. The sensing electrode TE may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material. The sensing electrode TE may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

An insulating layer IL2 may be disposed on the first sensing electrodes Tx. The insulating layer IL2 may include, for example, silicon nitride, but the insulating layer IL2 may include an organic material according to embodiments. The second sensing electrodes Rx may be disposed above the first sensing electrodes Tx. The second sensing electrodes Rx may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material. The second sensing electrodes Rx may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

An organic layer ORL may be disposed on the second sensing electrodes Rx. The organic layer ORL may include an organic material.

At least one of the first sensing electrodes Tx and the second electrodes Rx may be the conductive pattern CP. For instance, the sealing layer SL may include silicon nitride, and each of the first sensing electrodes Tx may include the first conductive pattern layer CPL1 including titanium, the second conductive pattern layer CPL2 including aluminum, and the third conductive pattern layer CPL3 including titanium. The insulating layer IL2 may include silicon nitride, and each of the second sensing electrodes Rx may include the first conductive pattern layer CPL1 including aluminum, the second conductive pattern layer CPL2 including titanium, and the third conductive pattern layer CPL3 including aluminum.

For instance, the sealing layer SL may include silicon nitride, each of the first sensing electrodes Tx may include one layer including aluminum, the insulating layer IL2 may include the organic material, and each of the second sensing electrodes Rx may include the first conductive pattern layer CPL1 including aluminum and the second conductive pattern layer CPL2 including titanium.

Referring to FIGS. 8A and 8B, the first and second sensing electrodes Tx and Rx may be disposed on the same layer. The first and second sensing electrodes Tx and Rx may be disposed on the sealing layer SL. The first sensing electrodes Tx are arranged in the fifth and sixth directions DR5 and DR6 to be spaced apart from each other.

The first sensing electrodes Tx spaced apart from each other in the fifth direction DR5 may be connected to each other by the first bridge BD1. The second sensing electrodes Rx may be arranged in the fifth and sixth directions DR5 and DR6 to be spaced apart from each other. The second sensing electrodes Rx spaced apart from each other in the sixth direction DR6 may be connected to each other by the second bridge BD2. The second bridge BD2 may be disposed on the first bridge BD1. Although not shown in figures, an insulating layer may be disposed between the first bridge BD1 and the second bridge BD2.

Each of the first and second bridges BD1 and BD2 may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material. Each of the first and second bridges BD1 and BD2 may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

The connection lines TL1 and TL2 may be electrically connected to the sensing electrode TE. The connection lines TL1 and TL2 may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material. The connection lines TL1 and TL2 may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

The connection lines TL1 and TL2 may include first connection lines TL1 and second connection lines TL2. The first connection lines TL1 may be connected to the first sensing electrodes Tx and first fan-out lines PO1. The second connection lines TL2 may be connected to the second sensing electrodes Rx and second fan-out lines PO2.

The fan-out lines PO1 and PO2 may be connected to the connection lines TL1 and TL2 and pad parts PD1 and PD2. The fan-out lines PO1 and PO2 may include the first fan-out lines PO1 and second fan-out lines PO2. The first fan-out lines PO1 may be connected to the first connection lines TL1 and the first pad part PD1. The second fan-out lines PO2 may be connected to the second connection lines TL2 and the second pad part PD2.

The first and second pad parts PD1 and PD2 may be electrically connected to the sensing electrode TE. The first and second pad parts PD1 and PD2 may include the first conductive pattern layer CPL1 and the second conductive pattern layer CPL2 disposed on the first conductive pattern layer CPL1. The first conductive pattern layer CPL1 may have the first thickness t1 and may include the first material. The second conductive pattern layer CPL2 may have the second thickness t2 smaller than the first thickness t1 and may include the second material different from the first material.

The first and second pad parts PD1 and PD2 may further include the third conductive pattern layer CPL3. The third conductive pattern layer CPL3 may be disposed on the second conductive pattern layer CPL2. The third conductive pattern layer CPL3 may have the third thickness t3 greater than the second thickness t2 and may include the third material.

The pad parts PD1 and PD2 may include the first pad part PD1 and the second pad part PD2. The first pad part PD1 may be connected to the first fan-out lines PO1. The first pad part PD1 may be electrically connected to the first sensing electrodes Tx. The second pad part PD2 may be connected to the second fan-out lines PO2. The second pad part PD2 may be electrically connected to the second sensing electrodes Rx.

Figure 9A:
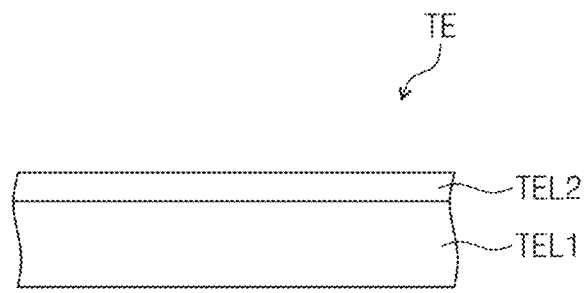
FIGS. 9A and 9B are cross-sectional views showing a sensing electrode included in a touch sensing unit according to an exemplary embodiment of the present disclosure.
Figure 9B:
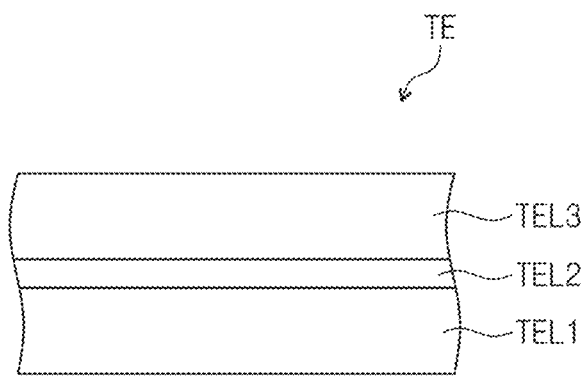

FIGS. 9A and 9B are cross-sectional views showing a sensing electrode included in a touch sensing unit according to an exemplary embodiment of the present disclosure.

Referring to FIGS. 9A and 9B, the sensing electrode TE may include a plurality of sensing electrode layers. The sensing electrode TE may include, for example, two, three, four, five, or six sensing electrode layers, but it should not be limited thereto or thereby. The sensing electrode TE may include seven or more sensing electrode layers.

The sensing electrode TE may include a first sensing electrode layer TEL1 and a second sensing electrode TEL2. The first sensing electrode layer TEL1 may include first grains each having a first grain size. The first sensing electrode layer TEL1 may include a first material. The second sensing electrode layer TEL2 may be disposed on the first sensing electrode layer TEL1. The second sensing electrode layer TEL2 may include second grains each having a second grain size. The second sensing electrode layer TEL2 may include a second material. The second material different from the first material. The second sensing electrode layer TEL2 may have a thickness smaller than that of the first sensing electrode layer TEL1.

The sensing electrode TE may further include a third sensing electrode layer TEL3. The third sensing electrode layer TEL3 may include third grains each having a third grain size. The third sensing electrode layer TEL3 may include a third material. The third material may be different from the second material. The third material may be equal to or different from the first material. The third sensing electrode layer TEL3 may have a thickness greater than that of the second sensing electrode layer TEL2.

Figure 9C:
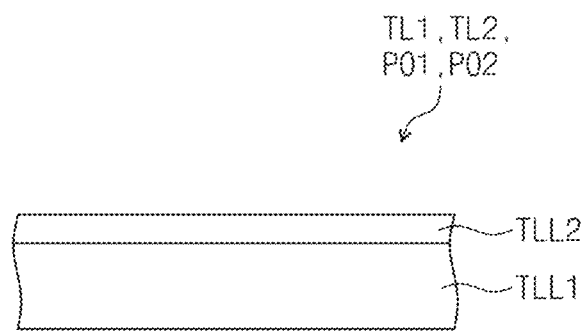
FIGS. 9C and 9D are cross-sectional views showing a line included in a touch sensing unit according to an exemplary embodiment of the present disclosure.
Figure 9D:
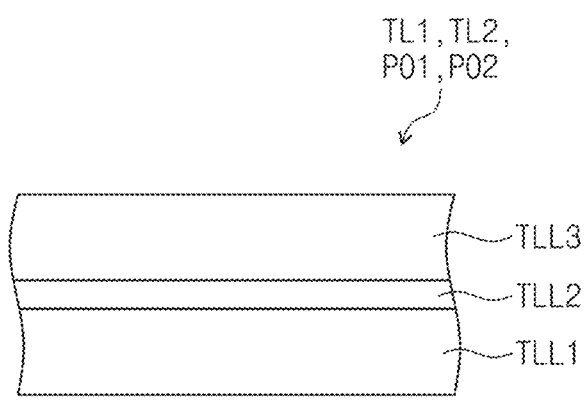

FIGS. 9C and 9D are cross-sectional views showing a line included in a touch sensing unit according to an exemplary embodiment of the present disclosure.

Referring to FIGS. 9C and 9D, lines TL1, TL2, PO1, and PO2 include a plurality of line layers. The lines TL1, TL2, PO1, and PO2 may include two, three, four, five, or six line layers, but they should not be limited thereto or thereby. The lines TL1, TL2, PO1, and PO2 may include seven or more line layers. An air layer may be provided between the line layers.

The lines TL1, TL2, PO1, and PO2 may include a first line layer TLL1 and a second line layer TLL2. The first line layer TLL1 may include first grains each having a first grain size. The first line layer TLL1 may include a first material. The second line layer TLL2 may be disposed on the first line layer TLL1. The second line layer TLL2 may include second grains each having a second grain size. The second line layer TLL2 may include a second material. The second material different from the first material. The second line layer TLL2 may have a thickness smaller than that of the first line layer TLL1.

The lines TL1, TL2, PO1, and PO2 may further include a third line layer TLL3. The third line layer TLL3 may include third grains, each having a third grain size. The third line layer TLL3 may include a third material. The third material may be different from the second material. The third material may be equal to or different from the first material. The third line layer TLL3 may have a thickness greater than that of the second line layer TLL2.

FIGS. 10A, 10B, 10C, 10D, 10E, and 10F are perspective views showing various devices to which a flexible display device may be applied according to an exemplary embodiment of the present disclosure.

Referring to FIGS. 10A, 10B, 10C, 10D, 10E, and 10F, the flexible display device according to the exemplary embodiment may be applied to various devices. For instance, the flexible display device may be applied to a mobile phone, a television, a computer, a wearable display device, a rollable display device, a foldable display device, an automotive display device, a decorative object display device, or the like.

Figure 10A:
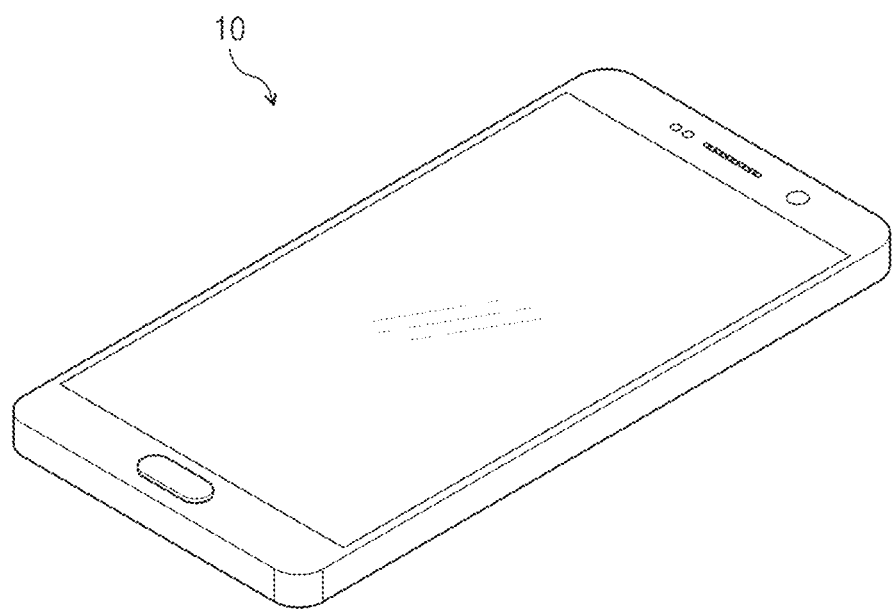
FIGS. 10A, 10B, 10C, 10D, 10E, and 10F are perspective views showing various devices to which a flexible display device is applied according to an exemplary embodiment of the present disclosure.
Figure 10B:
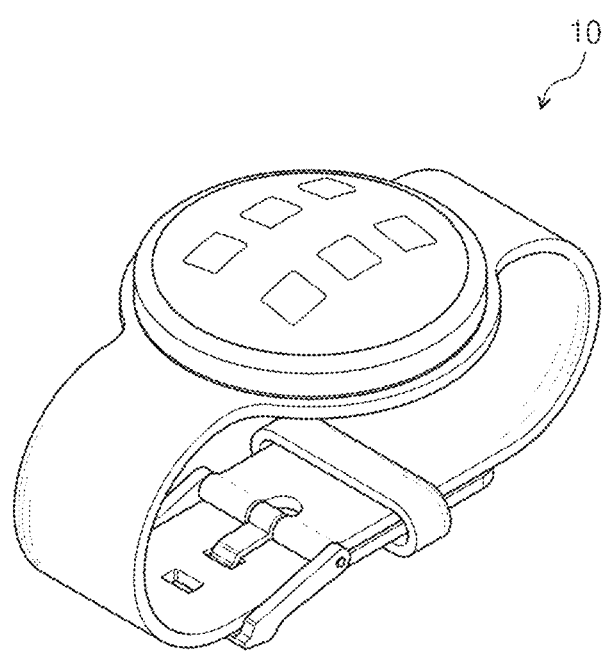

FIG. 10A shows the mobile phone to which the flexible display device may be applied, and FIG. 10B shows the wearable display device to which the flexible display device may be applied. The wearable display device should not be limited to a specific device as long as the device, e.g., a wrist watch, a glasses, a head-up display, etc., may be wearable on a human body.

Figure 10C:
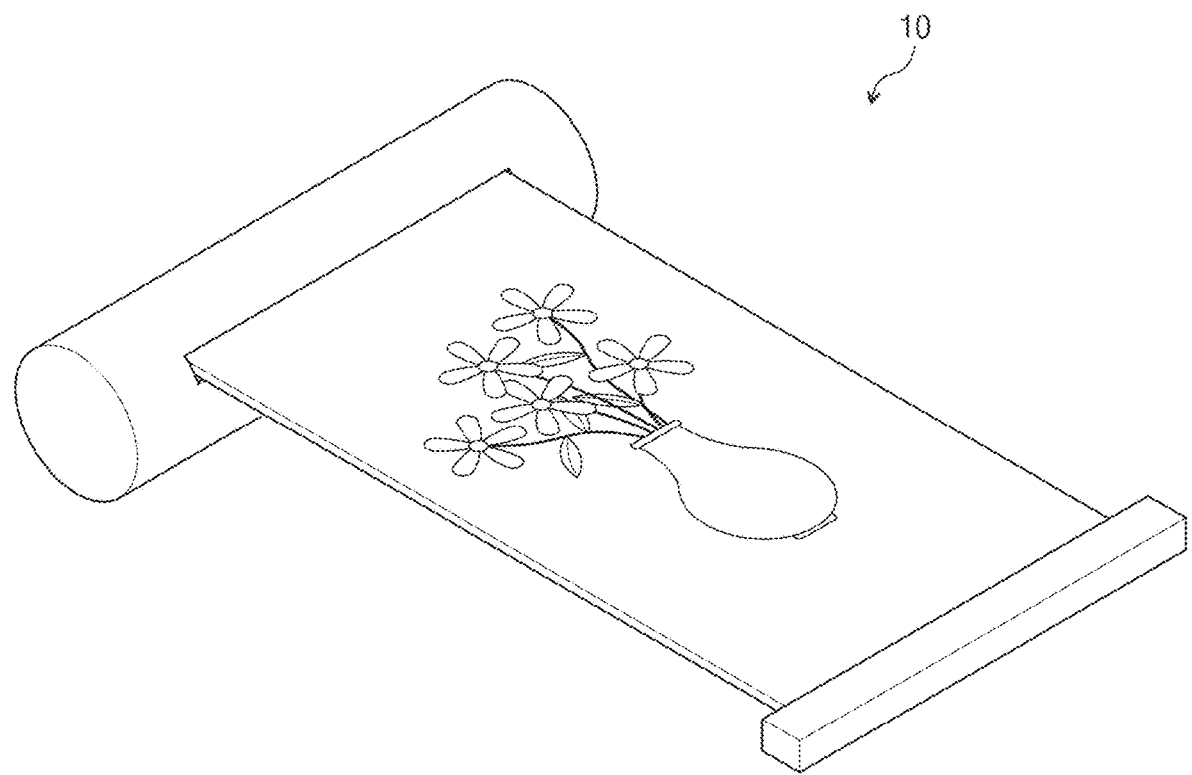
Figure 10D:
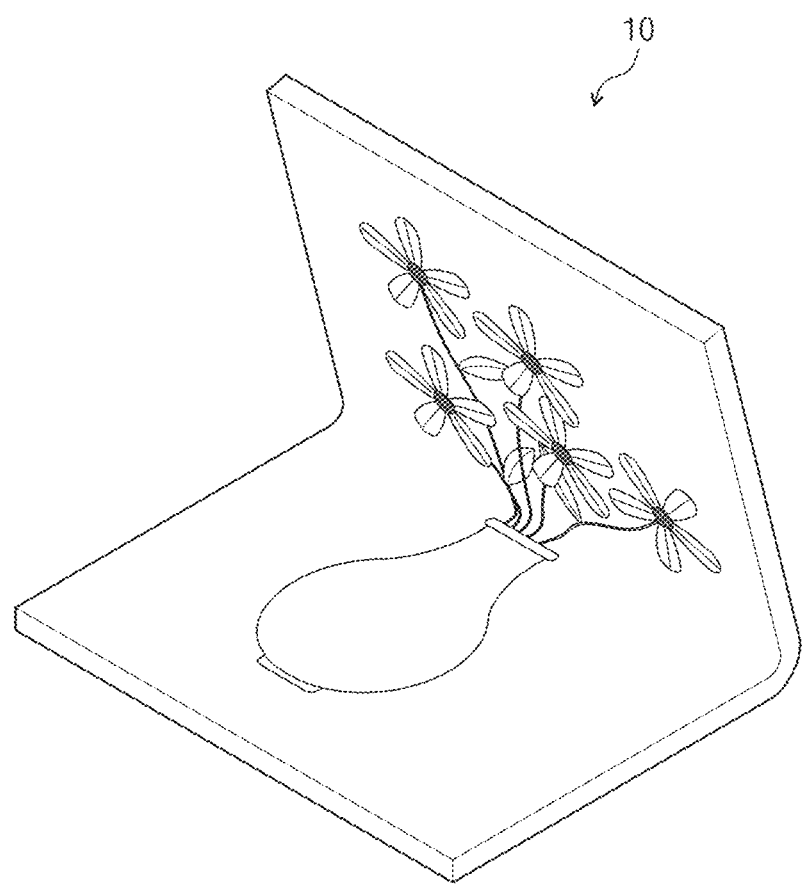

FIG. 10C shows the rollable display device to which the flexible display device may be applied. The rollable display device indicates a display device in which a display panel may be rolled or stretched with respect to a rolling axis included in a housing. FIG. 10D shows the foldable display device to which the flexible display device may be applied. The foldable display device indicates a display device folded or stretched with respect to one folding axis.

Figure 10E:
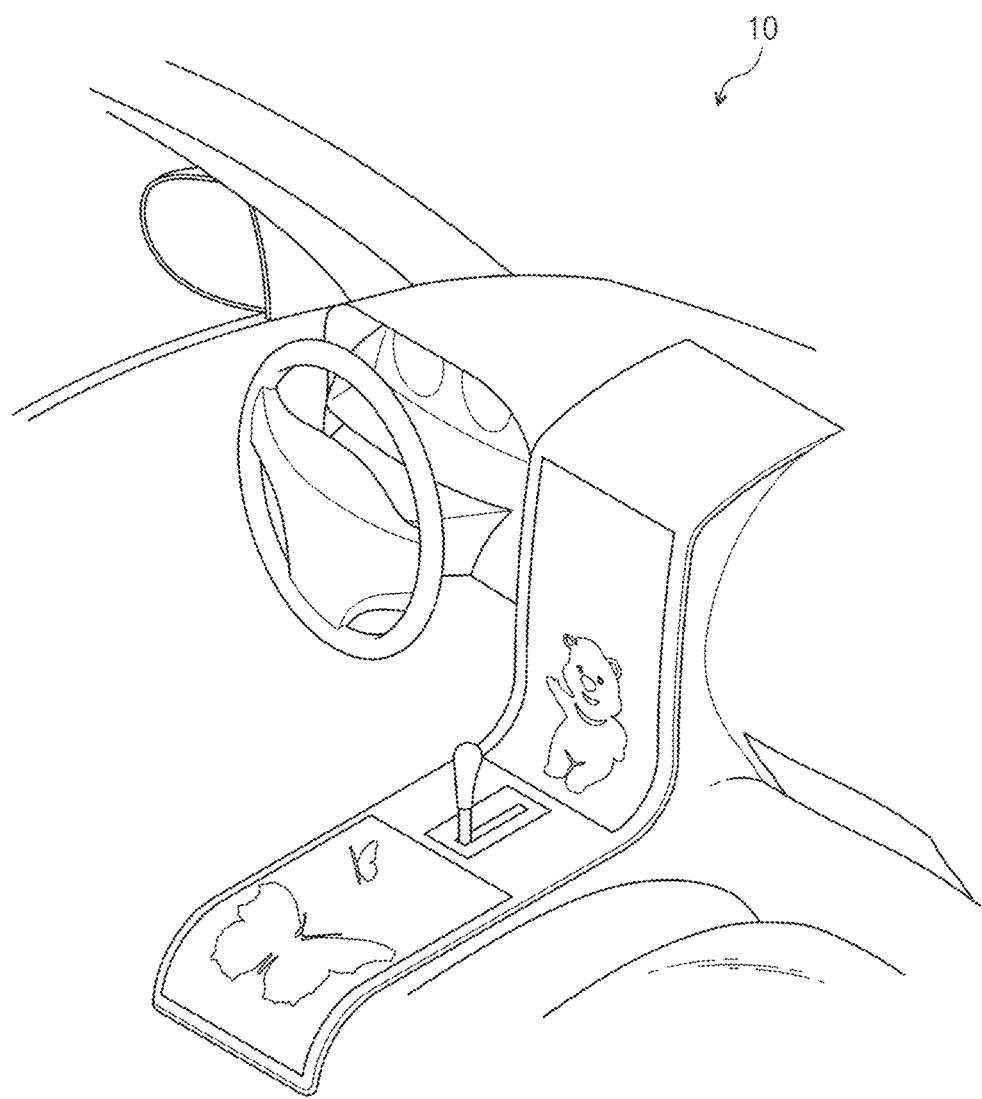

FIG. 10E shows the automotive display device to which the flexible display device may be applied. The automotive display device indicates a display device in transportation tools, e.g., car, air plane, ship, train, etc. The automotive display device may be the foldable display device or the rollable display device as long as it may be installed in a vehicle.

Figure 10F:
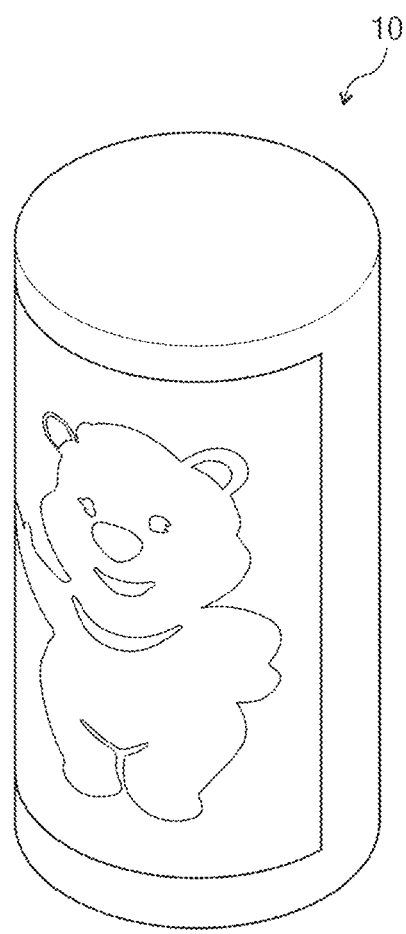

FIG. 10F shows a decorative object display device to which the flexible display device may be applied. FIG. 10F shows a display device placed on a part, e.g., a pillar, of buildings, but it should not be limited thereto or thereby.

A degree of deformation of the conductive patterns may become different depending on dislocation. As the dislocation increases, the degree of deformation of the conductive patterns increases. That is, as the dislocation increases, flexibility of the conductive patterns becomes more difficult when being bent. The dislocation decreases as a density of a grain boundary increases. Accordingly, the grain size of each of the conductive patterns may require reducing in order to increase the density of the grain boundary.

A conductive pattern of a conventional flexible display device may be formed to have one layer, and thus it may be difficult to reduce the size of the conductive pattern. In addition, in the case that the conductive pattern includes one layer, it may be difficult to form the conductive pattern including grains having a uniform grain size. Accordingly, the dislocation of the conductive pattern of the conventional flexible display device may be large, and thus it may be difficult to secure the flexibility for the bending of the conductive pattern. Thus, when the flexible display device may be repeatedly bent, a crack or disconnection occurs in the conductive pattern, and thus the reliability of the flexible display device may deteriorate.

In addition, since it may be difficult to ensure the flexibility for the bending of the conductive pattern, the crack or disconnection may occur in the conductive pattern when the conductive pattern is repeatedly bent in one direction and a direction opposite to the one direction. As described above, the conductive pattern included in the flexible display device according to the present exemplary embodiment may include the first conductive pattern layer having the first thickness and including the first material and the second conductive pattern layer having the second thickness and including the second material different from the first material. The conductive included in the flexible display device according to the present exemplary embodiment may include the second conductive pattern including the second material to adjust the grain size of the first conductive pattern layer. In addition, since the conductive pattern included in the flexible display device according to the present exemplary embodiment may include a plurality of layers including materials different from each other, the size of the grains may be relatively smaller than and relatively more uniform than that of conventional grains, and thus the flexibility for the bending of the conductive pattern may be easily secured. Accordingly, although the flexible display device may be repeatedly bent, an occurrence probability of the crack or disconnection of the conductive pattern may be significantly smaller than that of the conductive pattern included in the conventional flexible display device. Thus, the reliability of the flexible display device according to the exemplary embodiment of the present disclosure may be increased.

Further, since the flexible display device according to the exemplary embodiment of the present disclosure secures the flexibility for the bending, the occurrence probability of the crack or disconnection of the conductive pattern may be significantly lowered even though the flexible display device may be repeatedly bent in the one direction and the opposite direction to the one direction.

Hereinafter, the method of manufacturing the flexible display device according to an exemplary embodiment of the present disclosure. In the following description of the manufacturing method of the flexible display device, different features from those of the descriptions of the flexible display device will be mainly described.

Figure 11:
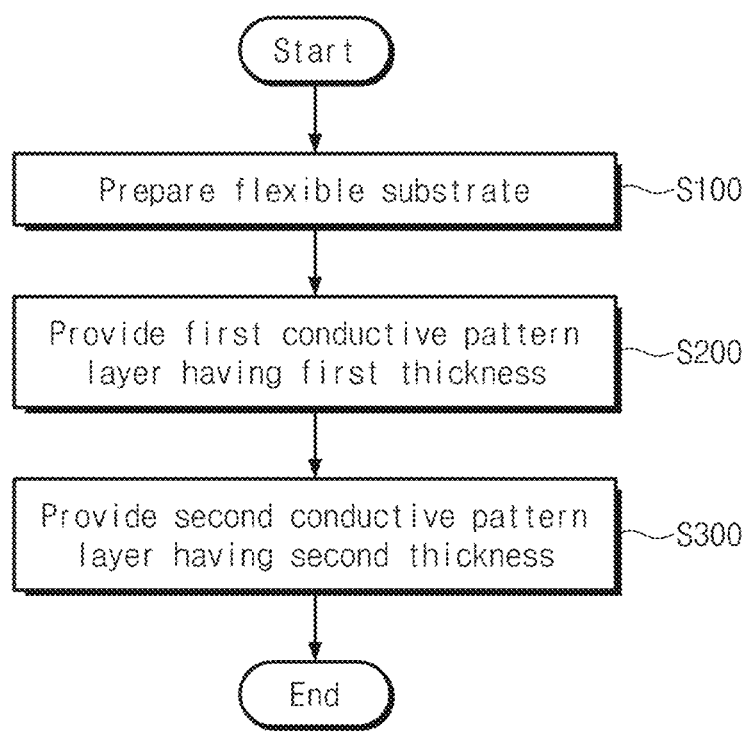
FIG. 11 is a flowchart showing a method of manufacturing a flexible display device according to an exemplary embodiment of the present disclosure.

FIG. 11 is a flowchart showing a method of manufacturing a flexible display device according to an exemplary embodiment of the present disclosure.

Referring to FIGS. 1A, 1B, 1C, 2A, 2B, and 11, the manufacturing method of the flexible display device 10 may include preparing the flexible substrate FB (S100) and providing the conductive pattern CP on the flexible substrate FB.

The flexible substrate FB may include, but is not limited to, a plastic material or an organic polymer, e.g., polyethylene terephthalate (PET), polyethylene naphthalate (PEN), polyimide, polyether sulfone, etc. The material for the flexible substrate FB may be selected in consideration of a mechanical strength, a thermal stability, a transparency, a surface smoothness, an ease of handling, a water repellency, etc. The flexible substrate FB may be transparent.

The conductive pattern CP may be provided on the flexible substrate FB. The providing of the conductive pattern CP may include providing the first conductive pattern layer CPL1 having the first thickness t1 (S200) and providing the second conductive pattern layer CPL2 having the second thickness t2 on the first conductive pattern (S300). The providing of the first conductive pattern layer CPL1 (S200) may be performed by providing a first gas and providing the first conductive pattern layer CPL1 having the first thickness t1 on the flexible substrate FB. The providing of the second conductive pattern layer CPL2 (S300) may be performed by providing a second gas different from the first gas and providing the second conductive pattern layer CPL2 having the second thickness t2 smaller than the first thickness t1 on the first conductive pattern layer CPL1.

The first conductive pattern layer CPL1 may have the first thickness t1 equal to or greater than about 100 angstroms and equal to or smaller than about 1500 angstroms. The first conductive pattern layer CPL1 may include the first grains GR1 each having the first grain size. The first grains GR1 of the first conductive pattern layer CPL1 have the first grain size equal to or greater than about 100 angstroms and equal to or smaller than about 1000 angstroms. The first conductive pattern layer CPL1 may include the first material. The first material may include at least one of a metal, a metal alloy, and a transparent conductive oxide, but it should not be limited thereto or thereby. In the first conductive pattern layer CPL1, about 200 grains to about 1200 grains are arranged within a unit area of about 1.0 square micrometers ($\mu m^2$).

The second conductive pattern layer CPL2 may prevent the first grains GR1 of the first conductive pattern layer CPL1 from being connected to the second grains GR2 of the second conductive pattern layer CPL2. The second conductive pattern layer CPL2 may control the first grain size of the first conductive pattern layer CPL1. For instance, the second conductive pattern layer CPL2 may prevent the first grain size of the first conductive pattern layer CPL1 from increasing excessively.

The second conductive pattern layer CPL2 may have the second thickness t2 equal to or greater than about 10 angstroms and equal to or smaller than about 100 angstroms. The second thickness t2 may be smaller than the first thickness. The second conductive pattern layer CPL2 may include the second grains GR2 each having the second grain size. The second conductive pattern layer CPL2 may include the second material. The second material may be different from the first material. The second material may include at least one of a metal, a metal alloy, and a transparent conductive oxide, but it should not be limited thereto or thereby.

At least one of the providing of the first conductive pattern layer CPL1 (S200) and the providing of the second conductive pattern layer CPL2 (S300) may be performed by sputtering at least one of a metal, a metal alloy, and a transparent conductive oxide. For instance, at least one of the first and second conductive pattern layers CPL1 and CPL2 may be formed through the sputtering process performed during a time period equal to or longer than about one minute and equal to or shorter than about three minutes at a room temperature. For instance, at least one of the first and second conductive pattern layers CPL1 and CPL2 may be formed through the sputtering process performed during the time period equal to or longer than about one minute and equal to or shorter than about three minutes at a temperature equal to or greater than about 50 degrees and equal or less than about 60 degrees.

The metal may include, but is not limited to, at least one of Al, Cu, Ti, Mo, Ag, Mg, Pt, Pd, Au, Ni, Nd, Ir, and Cr.

The transparent conductive oxide may include, but is not limited to, at least one of indium tin oxide (ITO), indium zinc oxide (IZO), zinc oxide (ZnO), and indium tin zinc oxide (ITZO).

The providing of the conductive pattern CP may further include the third conductive pattern CPL3 on the second conductive pattern CPL2. The providing of the third conductive pattern layer CPL3 may be performed by providing a third gas different from the second gas and providing the third conductive pattern layer CPL3 having the third thickness t3 on the second conductive pattern layer CPL2.

The third conductive pattern layer CPL3 may have the third thickness t3 equal to or greater than about 100 angstroms and equal to or smaller than about 1500 angstroms. The third conductive pattern layer CPL3 may include the third grains GR3 each having the third grain size. The third grains GR3 of the third conductive pattern layer CPL3 have the third grain size equal to or greater than about 100 angstroms and equal to or smaller than about 1000 angstroms. The third conductive pattern layer CPL3 may include the third material. The third material may be different from the second material. The third material may be equal to or different from the first material. The third material may include at least one of a metal, a metal alloy, and a transparent conductive oxide, but it should not be limited thereto or thereby. In the third conductive pattern layer CPL3, about 200 grains to about 1200 grains are arranged within a unit area of about 1.0 square micrometers ($\mu m^2$).

Each of the providing of the first conductive pattern layer CPL1 (S200), the providing of the second conductive pattern layer CPL2 (S300), and the providing of the third conductive pattern layer may be performed without a plasma.

The providing of the first conductive pattern layer CPL1 (S200) may be performed by using an aluminum gas, the providing of the second conductive pattern layer CPL2 (S300) may be performed by using a titanium gas, and the providing of the third conductive pattern layer CPL3 may be performed by using an aluminum gas. In this case, the first, second, and third conductive pattern layers CPL1, CPL2, and CPL3 may have thicknesses of about 1500 angstroms, about 50 angstroms, and about 1500 angstroms, respectively.

When the providing of the first conductive pattern layer CPL1 (S200) is performed by using aluminum gas, the providing of the second conductive pattern layer CPL2 (S300) may be performed by using titanium gas, and the providing of the third conductive pattern layer CPL3 may be performed by using aluminum gas, each of the providing of the first conductive pattern layer CPL1 (S200), the providing of the second conductive pattern layer CPL2 (S300), and the providing of the third conductive pattern layer may be performed five times.

The providing of the first conductive pattern layer CPL1 (S200) may be performed by using aluminum gas, the providing of the second conductive pattern layer CPL2 (S300) may performed by using oxygen gas, and the providing of the third conductive pattern layer CPL3 may performed by using aluminum gas.

The providing of the conductive pattern CP may be configured to include using a first gas to form a first layer, using a second gas different from the first gas to form a second layer, using a third gas different from the second gas to form a third layer, and etching the first, second, and third layers to form the first, second, and third conductive pattern layers CPL1, CPL2, and CPL3.

As another example, the providing of the conductive pattern CP may be configured to include using the first gas to form the first layer, etching the first layer using a first mask to form the first conductive pattern layer CPL1, using the second gas different from the first gas to form the second layer, etching the second layer using a second mask to form the second conductive pattern layer CPL2, using the third gas different from the second gas to form the third layer, and etching the third layer using a third mask to form the third conductive pattern layer CPL3.

A degree of deformation of the conductive patterns becomes different depending on dislocation. As the dislocation increases, the degree of deformation of the conductive patterns increases. That is, as the dislocation increases, the flexibility of the conductive patterns becomes more difficult when being bent. The dislocation decreases as a density of a grain boundary increases. Accordingly, the grain size of each of the conductive patterns may be required to be reduced to increase the density of the grain boundary.

A conductive pattern of a conventional flexible display device is formed to have one layer, and thus it is difficult to reduce the size of the conductive pattern. In addition, in the case that the conductive pattern includes one layer, it is difficult to form the conductive pattern including grains having a uniform grain size. Accordingly, the dislocation of the conductive pattern of the conventional flexible display device is large, and thus it is difficult to secure the flexibility for the bending of the conductive pattern. Thus, when the flexible display device is repeatedly bent, a crack or disconnection occurs in the conductive pattern, and thus the reliability of the flexible display device may deteriorate.

In addition, since it is difficult to ensure the flexibility for the bending of the conductive pattern, the crack or disconnection occurs in the conductive pattern when the conductive pattern is repeatedly bent in one direction and a direction opposite to the one direction. As described above, the conductive pattern included in the flexible display device manufactured by the manufacturing method according to the present exemplary embodiment may include the first conductive pattern layer having the first thickness and including the first material and the second conductive pattern layer having the second thickness and including the second material different from the first material. The conductive included in the flexible display device manufactured by the manufacturing method according to the present exemplary embodiment may include the second conductive pattern including the second material to adjust the grain size of the first conductive pattern layer. In addition, since the conductive pattern included in the flexible display device manufactured by the manufacturing method according to the present exemplary embodiment may include a plurality of layers including different materials from each other, the size of the grains may be relatively smaller than and relatively uniform than that of the conventional grains, and thus the flexibility for the bending of the conductive pattern may be easily secured. Accordingly, although the flexible display device may be repeatedly bent, an occurrence probability of the crack or disconnection of the conductive pattern may be significantly smaller than that of the conductive pattern included in the conventional flexible display device. Thus, the reliability of the flexible display device according to the exemplary embodiment of the present disclosure may be increased.

Further, since the flexible display device according to the exemplary embodiment of the present disclosure secures the flexibility for the bending, the occurrence probability of the crack or disconnection of the conductive pattern may be significantly lowered even though the flexible display device may be repeatedly bent in the one direction and the opposite direction to the one direction.

Hereinafter, the flexible display device according to the present disclosure will be described in detail with reference to various embodiment examples.

Embodiment Example 1

A process that forms aluminum conductive pattern layers having a thickness of about 50 nm by sputtering aluminum on a polycarbonate (PC) substrate at a temperature of about 60° C. during about two minutes was performed six times, and an aluminum oxide-conductive layer was formed between the aluminum conductive pattern layers. The conductive pattern including six aluminum conductive pattern layers and five aluminum oxide-conductive layers alternately stacked with the aluminum conductive pattern layers was formed.

Embodiment Example 2

The conductive pattern was formed through the same process as that shown in Embodiment example 1 except that the sputtering process was performed at a temperature of about 20° C. rather than about 60° C.

Embodiment Example 3

Aluminum was sputtered on the PC substrate to form a first aluminum conductive pattern layer having a thickness of about 150 nm, titanium was sputtered on the first aluminum conductive pattern layer to form a titanium conductive pattern layer having a thickness of about 5 nm, and aluminum was sputtered on the titanium conductive pattern layer to form a second aluminum conductive pattern layer having a thickness of about 150 nm.

Comparision Example 1

The conductive pattern having a thickness of about 300 nm was formed through the same process as that shown in Embodiment example 1 except that aluminum was sputtered on the PC substrate at a temperature of about 60° C. during two minutes.

Comparision Example 2

The conductive pattern was formed through the same process as that shown in Comparison example 1 except that the sputtering process was performed at a temperature of about 20° C. rather than about 60° C.

Comparision Example 3

The conductive pattern was formed through the same process as that shown in Embodiment example 1 except that the conductive pattern formed by sputtering aluminum on the polycarbonate (PC) substrate has a thickness of about 200 nm.

1. Measurement

Figure 12A:
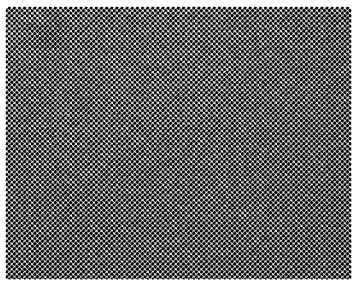
FIG. 12A is an SEM image of a first exemplary embodiment, a first comparison example, and a third comparison example.
Figure 12B:
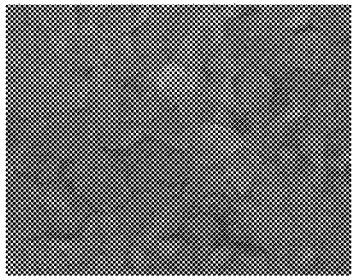
FIG. 12B is an SEM image of a first exemplary embodiment, a second exemplary embodiment, a first comparison example, and a second comparison example.
Figure 13:
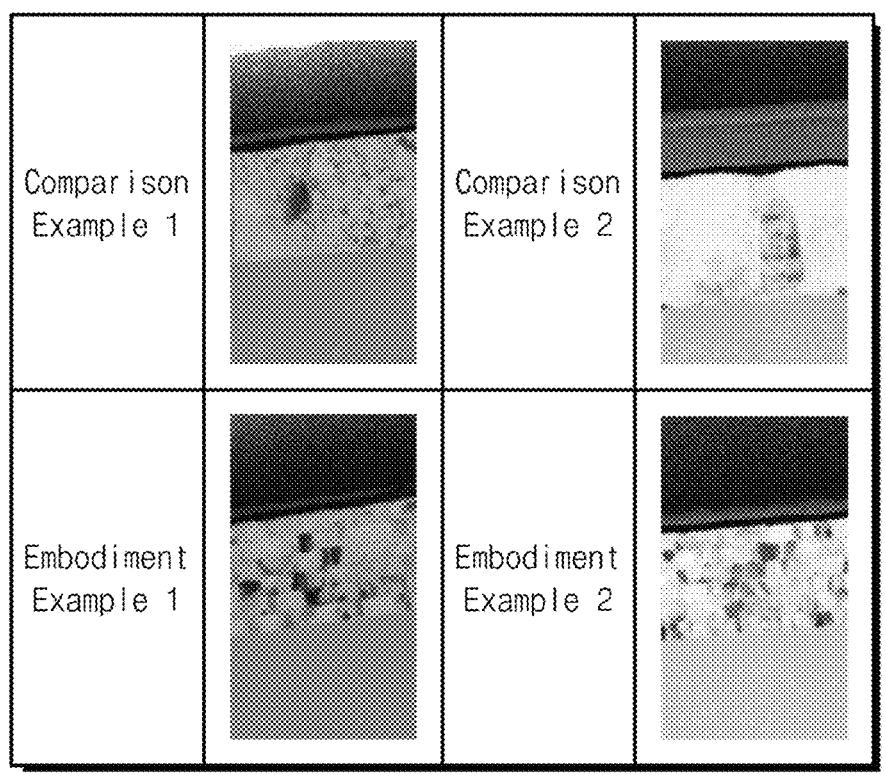
FIG. 13 is a cross-sectional photograph of a first exemplary embodiment, a second exemplary embodiment, a first comparison example, and a second comparison example.

1) Measurement of the Grain Size:

The grain size was measured by taking a scanning electron microscope (SEM) image of a cross section of Embodiment examples 1 to 3 and Comparison examples 1 and 2. The SEM image was taken by using Helios 450, FEI Co. The SEM images of Embodiment example 1 and Comparison examples 1 and 3 are shown in FIG. 12A, the SEM images of Embodiment examples 1 and 2 and Comparison examples 1 and 2 are shown in FIG. 12B, and the grain size may be represented by the following Table 1. In addition, SEM images of cross sections of Embodiment examples 1 and 2 and Comparison examples 1 and 2 are shown in FIG. 13.

TABLE 1

|  | Grain size (nm) |
|---|---|
| Embodiment example 1 | 32 |
| Embodiment example 3 | 97.7 |
| Comparison example 1 | 196 |
| Comparison example 2 | 119 |

2) Check Whether Disconnection Occurs Due to the Inner Bending and the Outer Bending The disconnections due to the inner bending and the outer bending of Embodiment examples 1 to 3 and Comparison examples 1 and 3 were checked. The disconnections due to the inner bending in Comparison examples 1 and 3 were shown in FIG. 14.

3) Measurement of a Resistance Variation Due to the Inner Bending and the Outer Bending The resistance variation due to the inner bending in Embodiment examples 1 to 3 and Comparison examples 1 and 3 and the resistance variation due to the outer bending in Embodiment examples 1 to 3 and Comparison examples 1 and 3 were measured. The resistance variation due to the inner bending was represented by the following Table 2 and the resistance variation due to the outer bending was represented by the following Table 3.

TABLE 2

| | Resistance variation (%) | | | | |
|---|---|---|---|---|---|
| Number of inner bendings | Embodiment example 1 | Embodiment example 2 | Embodiment example 3 | Comparison example 1 | Comparison example 3 |
| 0 | 0 | 0 | 0 | 0 | 0 |
| 50000 | 0 | 0 | 0 | 500 | 0 |
| 100000 | 0 | 0 | 0 | 500 | 9 |
| 150000 | 0 | 0 | 0 | 500 | 19 |
| 200000 | 0 | 0 | 0 | 500 | 24 |

TABLE 3

| | Resistance variation (%) | | | | |
|---|---|---|---|---|---|
| Number of outer bendings | Embodiment example 1 | Embodiment example 2 | Embodiment example 3 | Comparison example 1 | Comparison example 3 |
| 0 | 0 | 0 | 0 | 0 | 0 |
| 50000 | 0 | 0 | 0 | 303 | 0 |
| 100000 | 0 | 0 | 0 | 448 | 11 |
| 150000 | 0 | 0 | 0 | 506 | 27 |
| 200000 | 0 | 0 | 0 | 528 | 54 |

2. Measurement Result

1) Measurement of the Grain Size:

Referring to FIGS. 12A, 12B, and 13 and Table 1, the grain size of each of Embodiment examples 1 to 3 was smaller than the grain size of each of Comparison examples 1 to 3.

Figure 14:
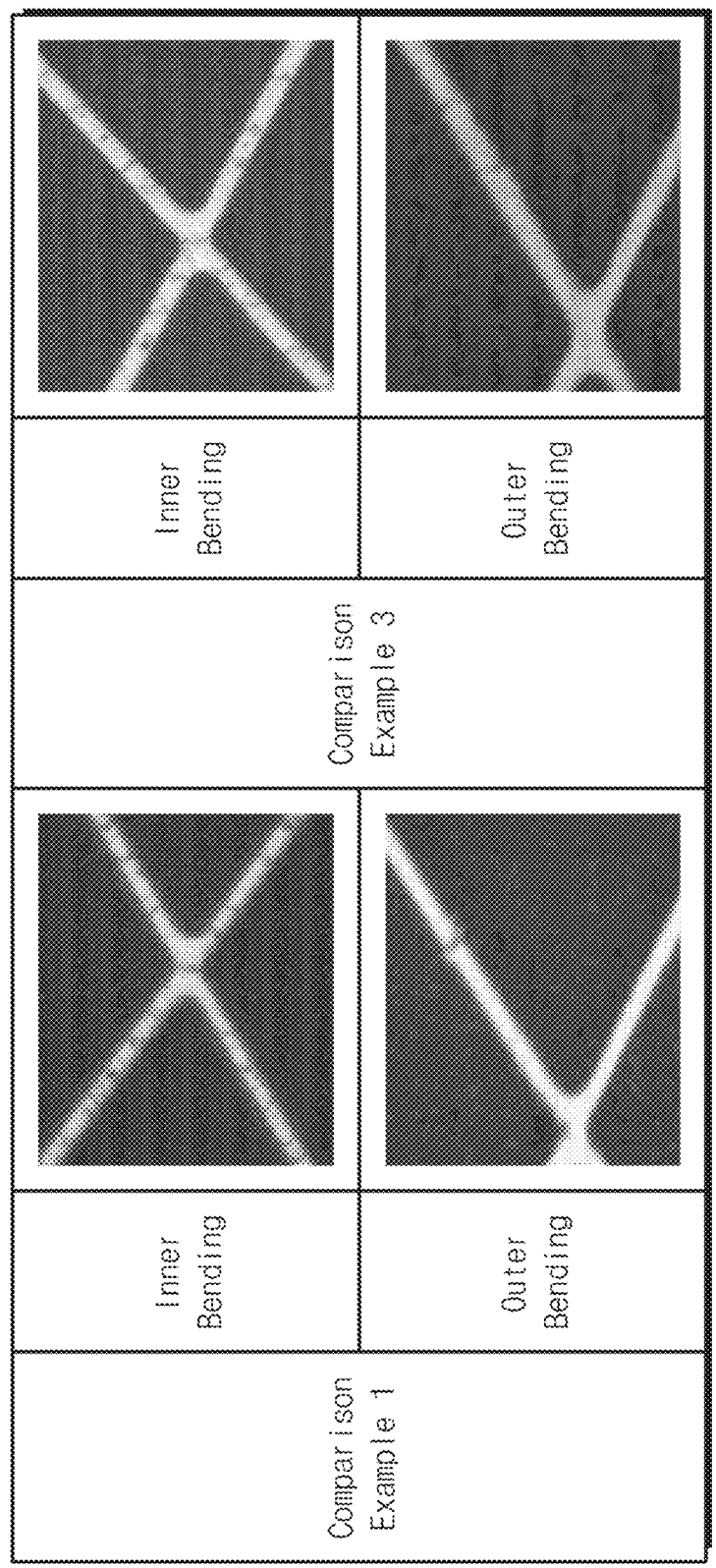
FIG. 14 is a photograph showing a line disconnection caused by an inner bending or an outer bending in a first comparison example and a third comparison example.

2) Check Whether the Disconnection Occurs Due to the Inner Bending and the Outer Bending The disconnections due to the inner bending and the outer bending do not occur in Embodiment examples 1 to 3, but the disconnections due to the inner bending and the outer bending occur in Comparison examples 1 and 3 as shown in FIG. 14.

3) Measurement of a Resistance Variation Caused by the Inner Bending and the Outer Bending Referring to Tables 2 and 3, the variation in resistance due to the inner bending and the outer bending was relatively small in Embodiment examples 1 to 3, but the variation in resistance due to the inner bending and the outer bending was relatively large in Comparison examples 1 and 3.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A flexible display device, comprising:
   a flexible substrate comprising a bending part; and
   a conductive pattern comprising a first conductive pattern layer and a second conductive pattern layer disposed on the first conductive pattern layer, wherein
   at least a portion of the conductive pattern is disposed on the bending part,
   the first conductive pattern layer is configured to have a first thickness and comprises a first material including first grains having a first size, and
   the second conductive pattern layer is configured to have a second thickness smaller than the first thickness and comprises a second material different from the first material and including second grains having a second grain size,
   wherein an average grain size of the first conductive pattern layer is greater than an average grain size of the second conductive pattern layer.

2. The flexible display device of claim 1, wherein the first thickness is equal to or greater than 100 angstroms and equal to or smaller than 1500 angstroms and the second thickness is equal to or greater than 10 angstroms and equal to or smaller than 100 angstroms.

3. The flexible display device of claim 1, wherein each of the first material and the second material comprises at least one of a metal, an alloy, an oxide, and a transparent conductive oxide.

4. The flexible display device of claim 3, wherein the metal comprises at least one of Al, Cu, Ti, Mo, Ag, Mg, Pt, Pd, Au, Ni, Nd, Ir, and Cr.

5. The flexible display device of claim 3, wherein the transparent conductive oxide comprises at least one of indium tin oxide (ITO), indium zinc oxide (IZO), zinc oxide (ZnO), and indium tin zinc oxide (ITZO).

6. The flexible display device of claim 1, wherein each of the first grain size and the second grain size is equal to or greater than 100 angstroms and equal to or smaller than 1000 angstroms.

7. The flexible display device of claim 1, wherein the second conductive pattern layer controls a grain size of the first conductive pattern layer.

8. The flexible display device of claim 1, wherein the conductive pattern further comprises a third conductive pattern layer disposed on the second conductive pattern layer, and the third conductive pattern layer has a third thickness which is greater than the second thickness and comprises a third material.

9. The flexible display device of claim 8, wherein each of the first thickness and the third thickness is equal to or greater than 100 angstroms and equal to or smaller than 1500 angstroms, and the second thickness is equal to or greater than 10 angstroms and equal to or smaller than 100 angstroms.

10. The flexible display device of claim 8, wherein the third material is different from the second material.

11. The flexible display device of claim 8, wherein the first material comprises aluminum, the second material comprises titanium, and the third material comprises aluminum.

12. The flexible display device of claim 11, wherein the conductive pattern comprises five stacking patterns, and each of the stacking patterns comprises
   the first conductive pattern layer,
   the second conductive pattern layer disposed on the first conductive pattern layer, and
   the third conductive pattern layer disposed on the second conductive pattern layer.

13. The flexible display device of claim 11, wherein the first thickness is 1500 angstroms, the second thickness is 50 angstroms, and the third thickness is 1500 angstroms.

14. The flexible display device of claim 8, wherein the first material comprises aluminum, the second material comprises aluminum oxide, and the third material comprises aluminum.

15. The flexible display device of claim 1, further comprising a wiring and an electrode, which are disposed on the flexible substrate, wherein at least one of the wiring and the electrode comprises the conductive pattern.

16. The flexible display device of claim 15, wherein the wiring comprises at least one of a gate line, a data line, a connection line, and a fan-out line.

17. The flexible display device of claim 1, further comprising:
   an insulating layer disposed on the flexible substrate;
   a first wiring disposed between the flexible substrate and the insulating layer; and
   a second wiring disposed on the insulating layer wherein at least one of the first wiring and the second wiring comprises the conductive pattern.

18. The flexible display device of claim 17, wherein the flexible display device is selected from a mobile phone, a television, a computer, a wearable display device, a rollable display device, a foldable display device, an automotive display device, and a decorative object display device.

19. The flexible display device of claim 1, wherein the flexible display device is configured to operate in a first mode in which at least a one portion of the flexible substrate and the conductive pattern is bent or in a second mode in which the at least one portion of the flexible substrate and the conductive pattern is stretched.

20. The flexible display device of claim 19, wherein the first mode comprises:
   a first bending mode in which the at least one portion of the flexible substrate and the conductive pattern are bent in one direction with respect to a bending axis; and
   a second bending mode in which the at least one portion of the flexible substrate and the conductive pattern are bent in a direction opposite to the one direction with respect to the bending axis.

21. A flexible display device comprising:
   a flexible display panel comprising a flexible substrate, an organic light emitting element disposed on the flexible substrate, and a sealing layer disposed on the organic light emitting element; and
   a touch sensing unit comprising a touch bending part and disposed on the sealing layer, the touch bending part including a conductive pattern comprising a first conductive pattern layer and a second conductive pattern layer disposed on the first conductive pattern layer, the first conductive pattern layer being configured to have a first thickness and comprising a first material, and the second conductive pattern layer being configured to have a second thickness smaller than the first thickness and comprising a second material different from the first material,
   wherein
   the touch sensing unit further comprises:
   a sensing electrode, a pad part electrically connected to the sensing electrode, a connection line connected to the sensing electrode, and a fan-out line connected to the connection line and the pad part; and
   wherein at least one of the sensing electrode, the pad part, the connection line, and the fan-out line comprises the conductive pattern.

22. The flexible display device of claim 21, wherein the sensing electrode has a mesh shape.

23. A method of manufacturing a flexible display device, comprising:
   preparing a flexible substrate; and
   providing a conductive pattern on the flexible substrate, the step of providing of the conductive pattern comprising:
   supplying a first gas to form a first conductive pattern layer configured to have a first thickness on the flexible substrate; and
   supplying a second gas different from the first gas to form a second conductive pattern layer configured to have a second thickness smaller than the first thickness on the first conductive pattern layer,
   supplying a third gas different from the second gas to form a third conductive pattern layer having a third thickness greater than the second thickness on the second conductive pattern layer.

24. The method of claim 23, wherein at least one of the forming of the first conductive pattern layer and the forming of the second conductive pattern layer is performed by sputtering at least one of a metal, an alloy, and a transparent conductive oxide.

25. The method of claim 23, wherein each of the forming of the first conductive pattern layer, the forming of the second conductive pattern layer, and the forming of the third conductive pattern layer is performed without a plasma.

26. The method of claim 23, wherein the forming of the first conductive pattern layer is performed by using aluminum gas, the forming of the second conductive pattern layer is performed by using titanium gas, and the forming of the third conductive pattern layer is performed by using aluminum gas.

27. The method of claim 26, wherein each of the forming of the first conductive pattern layer, the forming of the second conductive pattern layer, and the forming of the third conductive pattern layer is performed five times.

28. The method of claim 23, wherein the forming of the first conductive pattern layer is performed by using aluminum gas, the forming of the second conductive pattern layer is performed by using oxygen gas, and the forming of the third conductive pattern layer is performed by using aluminum gas.

29. A flexible conductive pattern, comprising:
   a first conductive pattern layer disposed on a flexible substrate and comprising a first material configured to have a first thickness;
   a second conductive pattern layer disposed on the first conductive pattern layer and comprising a second material different from the first material, the second material configured to have a second thickness smaller than the first thickness; and
   a third conductive pattern layer disposed on the second conductive pattern layer and comprising a third material having a third thickness which is greater than the second thickness.

30. The flexible conductive pattern of claim 29, wherein the first thickness is equal to or greater than 100 angstroms and equal to or smaller than 1500 angstroms and the second thickness is equal to or greater than 10 angstroms and equal to or smaller than 100 angstroms.

31. The flexible conductive pattern of claim 29, wherein each of the first thickness and the third thickness is equal to or greater than 100 angstroms and equal to or smaller than 1500 angstroms, and the second thickness is equal to or greater than 10 angstroms and equal to or smaller than 100 angstroms.

32. The flexible conductive pattern of claim 29, wherein the first conductive pattern layer has a first grain size, the second conductive pattern layer has a second grain size, and an average grain size of the first conductive pattern layer is greater than an average grain size of the second conductive pattern layer.

* * * * *